(12) United States Patent
Elberbaum

(10) Patent No.: US 7,864,500 B2
(45) Date of Patent: Jan. 4, 2011

(54) METHOD AND APPARATUS FOR REMOTELY OPERATING AC POWERED APPLIANCES FROM VIDEO INTERPHONES OR SHOPPING TERMINALS

(75) Inventor: David Elberbaum, Tokyo (JP)

(73) Assignee: Elbex Video Ltd., Tokyo (JP)

( * ) Notice: Subject to any disclaimer, the term of this patent is extended or adjusted under 35 U.S.C. 154(b) by 0 days.

(21) Appl. No.: 12/614,468

(22) Filed: Nov. 9, 2009

(65) Prior Publication Data

US 2010/0053838 A1    Mar. 4, 2010

Related U.S. Application Data

(62) Division of application No. 11/874,309, filed on Oct. 18, 2007, now Pat. No. 7,649,727.

(51) Int. Cl.
    *H01H 47/22*    (2006.01)
(52) U.S. Cl. .................................. 361/170; 361/187
(58) Field of Classification Search .................. 361/170, 361/187; 340/457.1, 856.2
    See application file for complete search history.

(56) References Cited

U.S. PATENT DOCUMENTS

| | | | |
|---|---|---|---|
| 5,579,221 A | 11/1996 | Mun | |
| 5,590,013 A | 12/1996 | Harasawa | |
| 5,923,363 A | 7/1999 | Elberbaum | |
| 6,603,842 B2 | 8/2003 | Elberbaum | |
| 6,787,815 B2 | 9/2004 | Suda et al. | |
| 6,940,957 B2 | 9/2005 | Elberbaum | |
| 2001/0010032 A1 | 7/2001 | Ehlers et al. | |
| 2003/0136967 A1 | 7/2003 | Suda et al. | |
| 2005/0273820 A1 | 12/2005 | Elberbaum | |
| 2006/0138231 A1 | 6/2006 | Elberbaum | |

FOREIGN PATENT DOCUMENTS

| | | |
|---|---|---|
| JP | 2003-218724 | 7/2003 |
| KR | 10-2007-0020775 | 2/2007 |
| WO | 2005/125189 | 12/2005 |

OTHER PUBLICATIONS

International Search Report dated Jun. 30, 2009, from corresponding International Application No. PCT/US2008/079018.
International Preliminary Report on Patentability and Written Opinion of the International Searching Authority dated Apr. 29, 2010, from corresponding International Application No. PCT/US2008/079018.
U.S. Appl. No. 11/509,315, filed Aug. 24, 2006.

*Primary Examiner*—Jared J Fureman
*Assistant Examiner*—Angela Brooks
(74) *Attorney, Agent, or Firm*—Katten Muchin Rosenman LLP

(57) ABSTRACT

A method for adding and connecting a remotely operated SPDT relay to an electric power circuit of an AC appliance connected to a manually actuated electrical SPDT switch for integrating said AC appliance into an home automation network, each said relay and said SPDT switch includes a pole terminal and dual traveler terminals and said relay is similar to a shape and a size of an AC switch fit for installation into a standard electrical box.

10 Claims, 15 Drawing Sheets

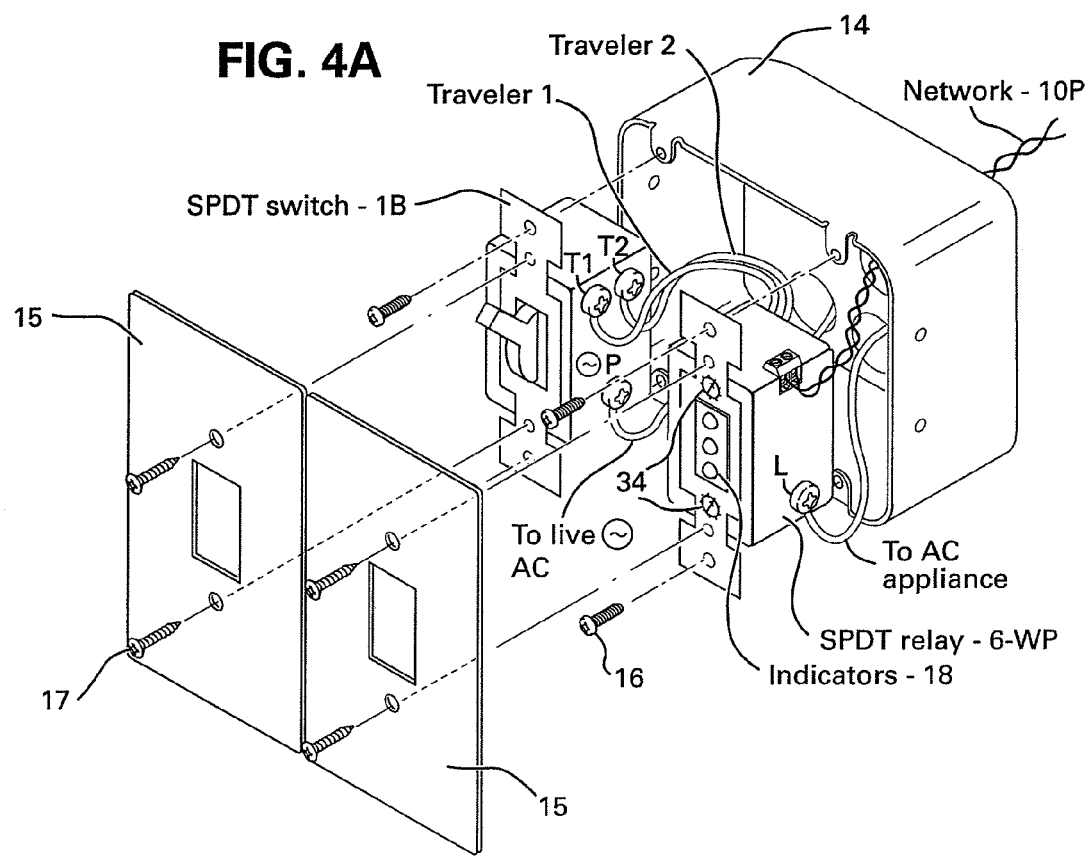
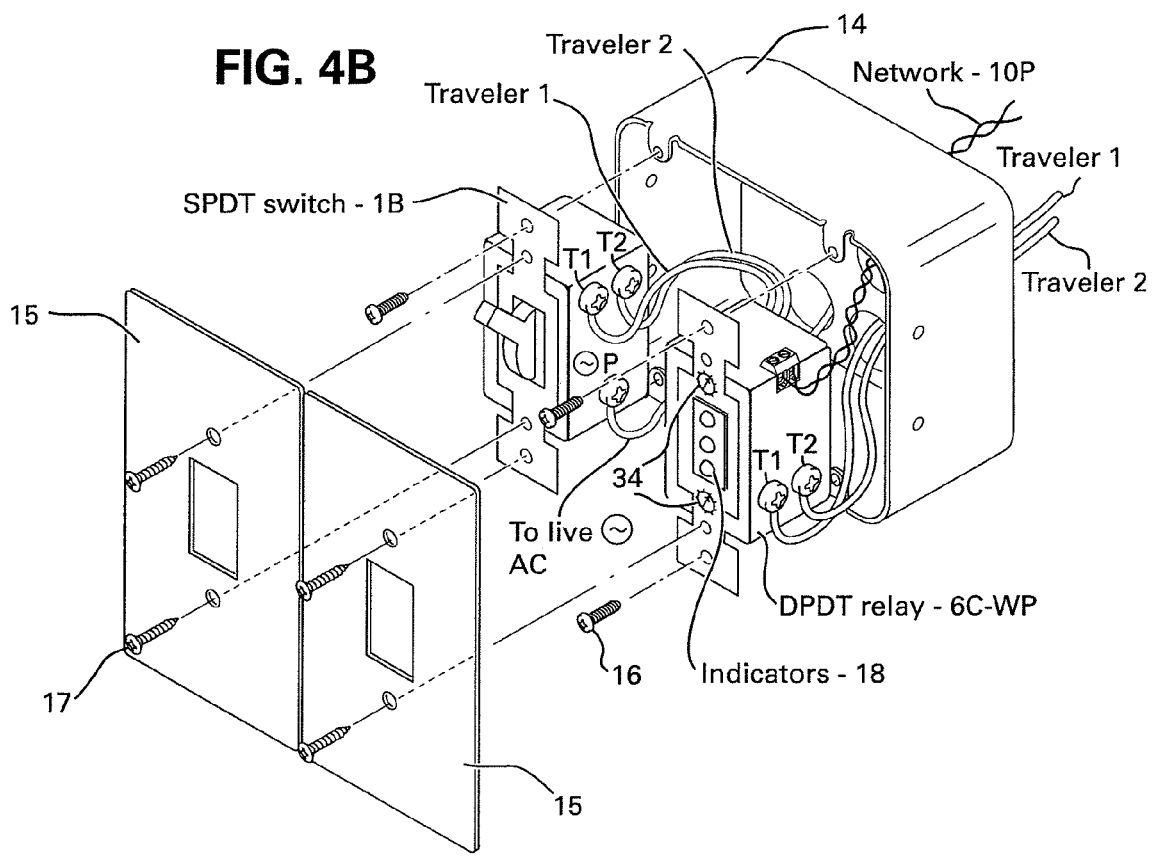

FIG. 14A FIG. 14B
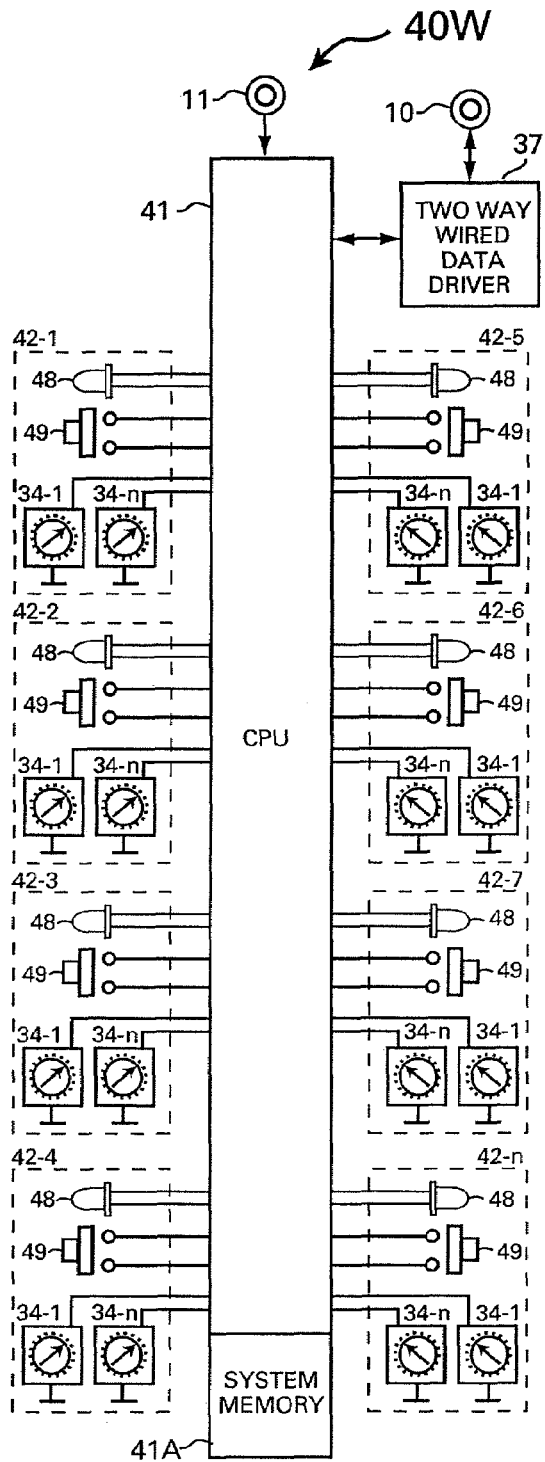
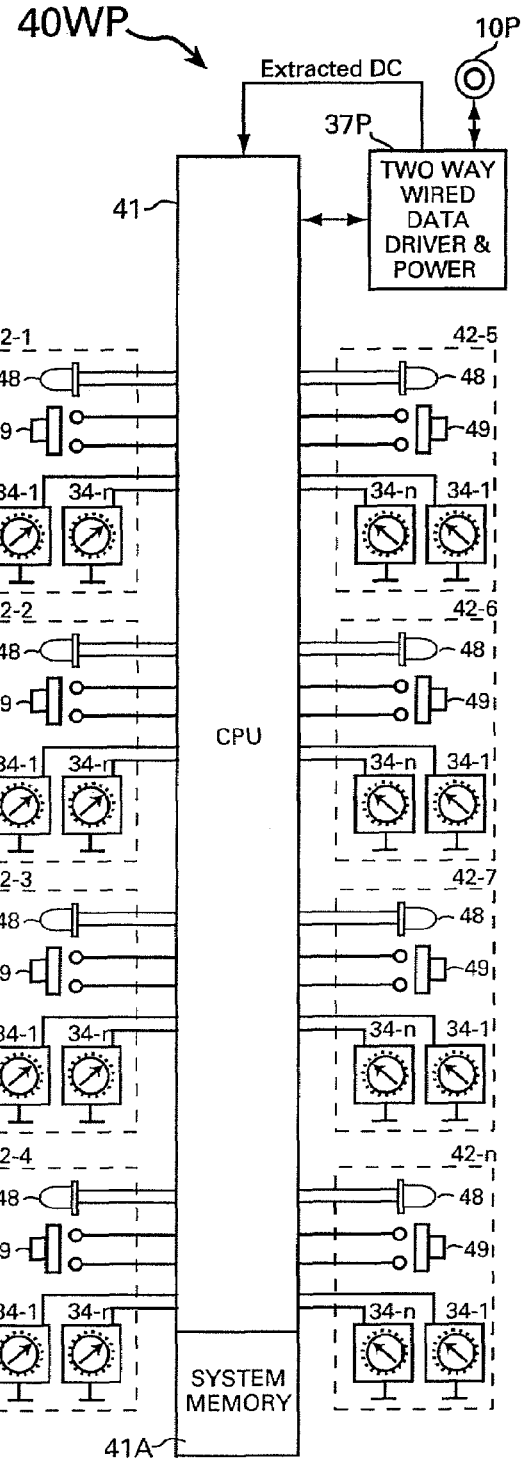

METHOD AND APPARATUS FOR REMOTELY OPERATING AC POWERED APPLIANCES FROM VIDEO INTERPHONES OR SHOPPING TERMINALS

CROSS-REFERENCE TO RELATED APPLICATIONS

This application is divisional application and claims priority to U.S. Ser. No. 11/874,309, which is pending and which was filed on Oct. 18, 2007, and which is hereby incorporated by reference its entirety for all purposes

BACKGROUND OF THE INVENTION

1. Field of the Invention

This invention is related to video interphone system and to wired or wireless control, including IR and RF, used for remotely operating AC switches and AC powered electrical devices and appliances.

2. Description of the Prior Art

Wired or wireless remote control devices including Infra-Red (IR) or RF transmitter for remotely operating AC powered electrical appliances such as television receivers, home heaters, air conditioners, motorized curtains, lighting and other electrical appliances in homes, apartments, offices and buildings in general are switched on and off by a one way control or command signal, with the person operating the remote control device verifying the on or off status of the operated device by visual means, such as the TV is on, or the lights are off, or the air condition unit is activated or not, by being at the site of the operated appliance. Most of the remote control devices, including IR or wireless remote control devices use the same power key to switch the appliance on and off, therefore without the operating person's self verification on site, with most of currently available remote control devices it is impossible to positively verify the on-off power status without being at the appliance site.

On the other hand home automation relay devices, operated via two way communication signals can be updated with the relay's status by a returned status signal. The problem such system represents is the cost for customizing of the AC electrical wiring, coupled with the on-off switching devices which are expensive and require expertise to configure, install and setup. One reason is that the wiring systems that are used for the light's (or other appliances) on-off switches do not include the neutral wire of the AC mains. The commonly wired electrical systems provide only two wires for the switches, the AC live or hot wire and the load wire that leads to the light fixture or other appliance. Similar two only traveler wires are used for connecting several switches that are tied up to switch on-off the same light or appliance.

The "two only AC wires" with no neutral wire at the switch's electrical box, prevent simple introduction of home automation, requiring changes to the commonly used electrical wiring. Therefore, the introduction of home automation devices calls for replacing the hardwired, the commonly used electrical AC switches and the AC outlets for transforming the basic standard electrical wiring, such as used for lighting, into a sophisticated operating systems that require maintenance and interventions by experts to repair or update, which is troublesome and costly.

Moreover, AC power devices that are directly connected to live AC power lines within the buildings must be tested to comply with electrical safety laws, rules and regulation and obtain approval and certification by organizations such as the UL in the USA, VDE or TUV in Europe, BS in the UK and similar organizations in other countries. The testing and approval processes are costly and time consuming, which makes approvals of customs designed AC electrical switches, AC electrical outlets and AC electrical interfaces for home automation out of reach to the mass market, limiting the proliferation of the much needed home automation to only custom designed AC switches, outlets and interfaces, for use in very expensive homes.

The significance with remote controlling of home automation systems is the ability to switch electrical appliances on and off remotely via PCs through the Internet, via mobile telephones and/or via other PDA devices. The problem however for such remote controlling is the need for a verified on-off status of the appliances being operated and/or the availability of a status report covering all the remotely controlled appliances of a given house, office, apartment or a building.

Many existing home automation systems and devices operate over wired or wireless home network, using variety of complex communication protocols, such as the known X10 protocol via AC power line, as well as currently being formulated "Zigbee" standard for wireless communications and/or other bluetooth communications through a single controller, or plurality of controllers, including control devices such as keypads and/or LCD displays and/or touch screen devices. Similarly, such method and apparatuses for integrating remote control devices with video interphone systems and shopping terminals are also disclosed in U.S. application Ser. No. 11/024,233 dated Dec. 28, 2004 and U.S. application Ser. No. 11/509,315 dated Aug. 24, 2006.

SUMMARY OF THE INVENTION

It is an object of the present invention to provide a simplified method and apparatus for adding relays and AC current on-off sensing devices to any type of an existing standard electrical switches and outlets with minimal exposure to live AC power lines, which provide a low cost solution for the much needed home automation. Another object of the present invention is to operate and monitor the status of the electrical appliances through video interphones and/or "shopping terminals" including the generating of the control codes and signals from the video interphones and shopping terminals to the different appliances through a driver circuits as described in the above referenced application Ser. Nos. 11/024,233 and 11/509,315. "Shopping terminals" are disclosed in U.S. application Ser. No. 10/864,311 dated Jun. 8, 2004 and PCT international application PCT/US05/19564 dated Jun. 3, 2005 for method and apparatus for simplified e-commerce shopping via home shopping terminals. Video interphones systems are disclosed in U.S. Pat. Nos. 5,923,363, 6,603,842 and 6,940,957.

In the following description the term live AC refers to the "hot line" of the AC power or mains, as oppose to the neutral line of the AC power or mains. The term load refers to an appliance such as light fixture that is connected between the neutral line and the live AC line via the on-off switch.

The apparatus for remotely operating AC powered appliances and other objects of the present invention are attained by an add on devices comprising wired, IR or RF receivers including AC power relays for receiving one way operational commands to operate the electrical appliances and/or wired, IR or RF transceivers including AC power relay and AC current sensors for receiving one way operational command to operate the electrical appliances and for transmitting on-off status signals from the appliances, in response to the received operational command or in response to an inquiry command (a request for status data) on the basis of the current sensor output, thereby providing error free remote controlling of the electrical home appliances.

The solution offered by the present invention, is to install an add on devices that include relays and current sensors, packaged or encapsulated with said wired, IR or wireless receiver or transceiver into a standard size casing of an AC switch or outlet, and using such packaged "add on device" to augment any type of standard manual on-off switch for electrical appliances or lighting and not by replacing the whole existing electrical switches and wiring.

The method of adding packaged relays and/or current sensors interfaces to an existing standard electrical switches and outlets instead of replacing them, introduces several major advantages; one is the lowering of the overall cost of the switches and outlets, because standard low cost, mass produced switches and outlets can be used. The second advantage is that the "add on devices" provide dual operation, manual operation via the commonly used switches and outlets on one hand and remote operation, in parallel with manual operation, via the relays of the add on devices. These advantages are the other objects of present invention, attained with total harmony and with no conflict between the manual and remote switching operation as described further below.

Another practical objective attained by the present invention is the freedom to select any from the wide variety of AC switches and outlets along with any of the extensive decorative covers and frames including variety of design and colors that are available and are being regularly introduced to the construction/electrical industry. Hence, this invention solves the persisting difficulties to match such wide range of available AC switches and outlets designs, their panel colors and decorations, particularly in a situation when a single home automation AC switch or an AC outlet is introduced but does not match the design or the color of a standard selected switches or AC outlets, that are installed into a multi gang switches/outlets setup.

Two types of switches for AC appliances and light fixture are commonly used; a single pole-single throw (SPST) and a single pole-double throw (SPDT) switch. The SPST switch is a basic on-off switch and the SPDT is a change over switch. The SPDT switches are used for on-off switching of a given appliance such as light fixture from two separate positions, such as from the two entrances of the same hall or a room. In instances were three or more switches are needed to switch on-off the same light fixture of a given hall or room, another type of dual pole-dual throw (DPDT) switches are used. The DPDT switches are connected in a given straight-cross configuration in between the two SPDT switches described above. The DPDT switches and the DPDT relays described are also known as "reversing" or 4 way switches or relays.

As will be explained later, the two SPDT switches including the one or more DPDT switches connected in a specific configuration that are described in details later, provide for each individual switch to operate on its own, regardless of the other switches status. Therefore any of the switches that are connected in such SPDT and/or DPDT setup configuration will switch on and off the light fixture irrespective of the other connected switches status. This further means that there is no specific on or off position for any of the connected switches levers, and the switching on or off is achieved by the pushing of the switch lever to its opposite position.

Accordingly the object of the present invention is to connect an SPDT relay to an SPDT light switch that are connected for operating a light fixture or other electrical appliance, thereby maintaining the operation via a "commonly used" manual switch and provide remote switching via the SPDT relay connected to the switch in a given configuration.

Another object of the present invention is to provide for connecting DPDT relay for remotely switching on-off light fixture or other electrical appliance that are connected to two manual SPDT switches and to a more comprehensive switching setup that includes two SPDT and one or more DPDT switches.

As explained above, the use of SPDT and DPDT relays in the "add on devices" of the present invention, or in other existing home automation electrical relay, switches and outlets, it will not be possible to identify the on-off status of the appliance, unless the data of all the switches and relays status of a given circuit are transmitted to the controller. This mandates the feeding and recording of all the switch's and the relay's data to the controller during the installation, which is complicated, troublesome and prone to errors. This may cause also complicated data handling and ensuing operational complications, requiring the transmitting of all the data every time a manual switch or relay is activated in the system, and this in return introduces substantial more data traffic and processing.

For this reason the other important object of the present invention is the introduction of AC current sensor for identifying when the appliance is switched on. The connecting of live AC power line to an electrical circuit calls for the use of large electrical components and as explained above, mandates a compliance with the electrical safety laws, rules and regulations such as the UL which is costly and time consuming. Therefore the current sensor of the preferred embodiment of the present invention is not connected to the AC line, instead the current is detected by AC induction. For this reason the AC switches and outlets of this invention are provided with a structural passage for the AC electrical wire to pass through an opening in a coil assembly for detecting the current drain through the AC wire running through the sensors.

A toroidal or other structured coil having an opening for enabling the AC wire to pass through, so that the current drain in the AC power wire will generate a corresponding signal level at the coil output terminals. For such induction current sensing the coil does not need to be connected to any live AC line, while its output signal is dependent upon the AC current through the AC wire. The coil output is processed by a signal detecting circuit and the CPU of the "add on devices" for generating the on-off status data.

The add-on devices of the present invention includes a receiver or a transceiver for receiving commands to operate the relays and for transmitting in return the data pertaining the on or off status of the appliance. On the basis of the level of the AC current fed through the current sensing coil, said on status may include more than a simple on data. For example, an AC outlet for a TV receiver or a PC that are in a sleeping mode and consume smaller current than the full operating current, will cause the current sensing coil to output lower sensing signal level, which can be measured by the signal detecting circuit and processed by the CPU for the transceiver to generate a sleeping mode status data.

The received and transmitted data are fed via a communication network selected from a group consisting of wired network, two way IR network, RF wireless network and combinations thereof. For example a television receiver can be powered via a standard AC outlet, with the AC wire connecting to the AC outlet for the television receiver passes through said add-on device, while the power on command to the television may be transmitted via an hand held IR remote control or via an IR driver described in above U.S. referenced application Ser. No. 11/509,315 and/or through the video interphone described in U.S. Pat. Nos. 6,603,842 and 6,940,957 and/or the shopping terminal disclosed in U.S. application Ser. No. 10/864,311.

The transceiver of the add-on device, including the current sensor through which the AC power is fed to the television receiver, transmits to the home automation controller, the video interphone or the shopping terminal, in return to a power-on command to the television receiver, a reply that a power-on is detected using the wired, IR or the RF wireless network employed for the home automation, thereby updating the home automation controller, or said video interphone or the shopping terminal described in above referenced patents and applications, with the television "on status", or "off status" if the command was to switch off the television.

The reference to home automation controller hereafter is to a display device with control keys or touch screen and circuits similar to the video interphone and/or the shopping terminal disclosed in the applications and the US patents referred to above.

BRIEF DESCRIPTION OF THE DRAWINGS

The foregoing and other objects and features of the present invention will become apparent from the following description of the preferred embodiments of the invention with reference to the accompanying drawings, in which:

FIGS. 4A and 4B are exploded views showing the installation and the connections of SPDT switch with SPDT and DPDT relay of the present invention, operated via wired network;

FIGS. 14A and 14B are block diagrams of a key panel or keypad for switching on and off a selected appliances via wired network.

DETAILED DESCRIPTION OF THE PREFERRED EMBODIMENTS

Figure 1A:
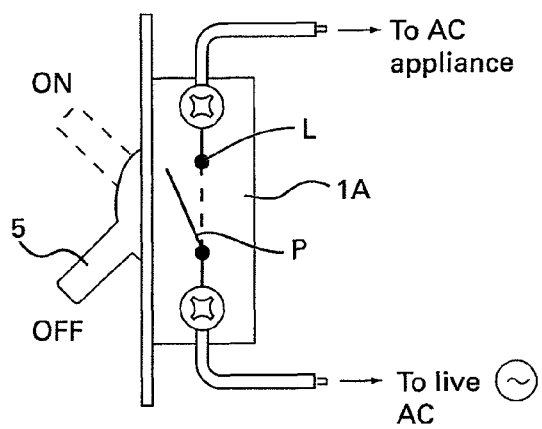
FIGS. 1A~1D are electrical drawings, connections and illustrations of common electrical SPST and SPDT switches for use with home appliances.

Shown in FIG. 1A is a standard on-off switch 1A used for operating AC appliances including appliances such as light fixtures, air conditioners and any other electrical devices that are operated by AC power. The standard on-off switch 1A is known as single pole-single throw (SPST) switch that includes lever activated spring contacts for making (on state) or breaking (off state) the electric circuit carrying AC current to the appliance. Remotely operated switch used for home automation is in fact a relay activated contacts (not shown) for making or breaking the AC current fed to an AC appliance, similar to the switch 1A of FIG. 1A.

For error free remote switching of the appliance it is necessary to know the appliance on or off status. It is possible to know the on or off status when using remotely operated SPST relay, on the basis of the data fed to the relay driver circuit, such as the driver 36 shown in FIG. 11A, which may be a driver transistor or IC. There is however a structural problem with remote on-off controlling of appliances via remote control devices including hand held IR or wireless remote control and/or wired control devices and systems, whereby such devices use the same key for switching the appliance on and off. For example almost all of the remote control units for television sets use the same key for on and off commands and most of the remote control units are not fed back with the on-off status of the television receiver. This makes the remote controlling of a television set unreliable when the control is generated from remote location, away from the television set such as through the Internet. For error free remote controlling the controller must verify the appliance status, in particular if the appliance is switched on or off. This is a fundamental need, including the ability to remotely receive a data pertaining all the appliances in the home, apartment, office or the building.

Figure 1B:
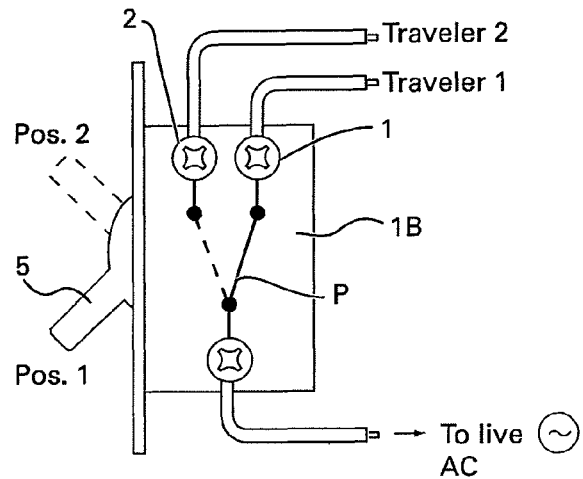

The electrical switch 1B shown in FIG. 1B is a single pole-dual throw switch known as SPDT switch. The SPDT switch is a change over switch, wherein the pole P is connected to terminal 1 or terminal 2 by the switch lever 5.

The SPDT switch can be used for making or braking the AC electrical current to an AC appliance, the same way the basic on-off switch 1A operates, such as connecting live AC to the pole P and the appliance to terminal 2 of SPDT switch 1B. Such SPDT switches are specifically used in homes for operating light fixtures and appliances because the SPDT switch provides for operating the appliance, such as light fixture from two separate locations.

Figure 1C:
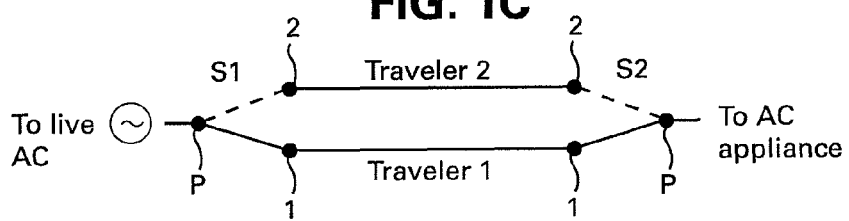
Figure 1D:
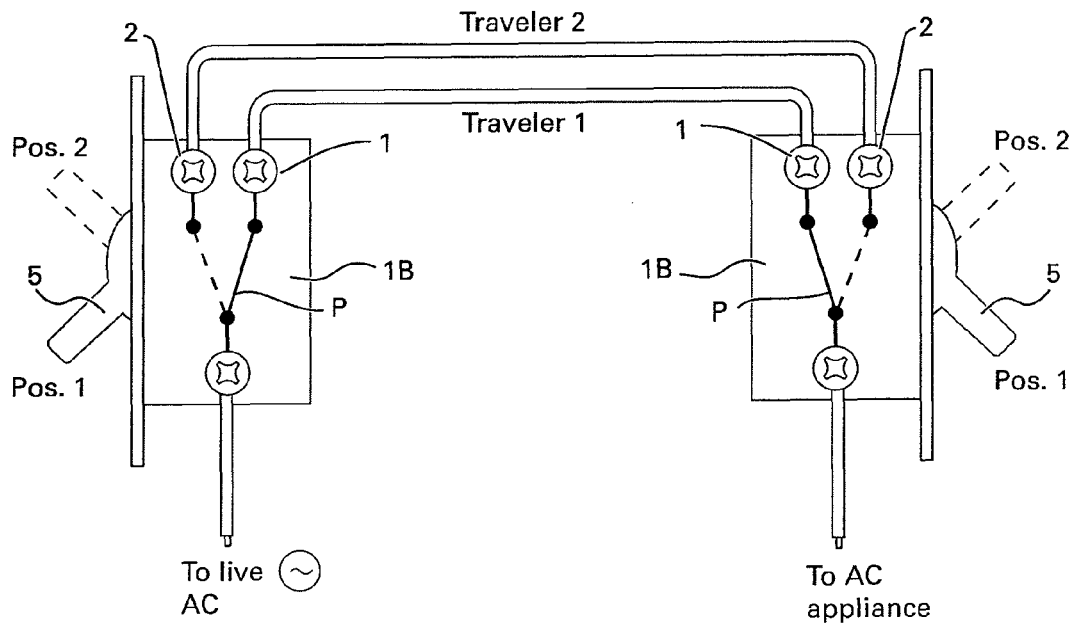

As shown in FIG. 1B the SPDT switch is connected through its terminals 1 and 2 to two lines known as travelers, traveler 1 and traveler 2. Shown in FIG. 1C is the electrical circuit of two SPDT switches S1 and S2 that are connected via traveler 1 and traveler 2 between the two switches' terminals 1 and 2. Each of the switches can independently make or brake the electrical current to the AC appliance. From the circuit shown in FIG. 1C and the illustration in FIG. 1D it become evident that whenever both switches S1 and S2 of FIG. 1C and/or when both switches 1B of FIG. 1D are switched to the same traveler line, be it traveler 1 or traveler 2 the AC appliance is connected to the live AC line (on state). When one of the switches S1 or S2 is connected to traveler 1 and the other is connected to traveler 2 the line is cut and the appliance is in off state. Same applies to the shown SPDT relay 6 connected to the SPDT switch 1B shown in FIG. 2A.

Figure 2A:
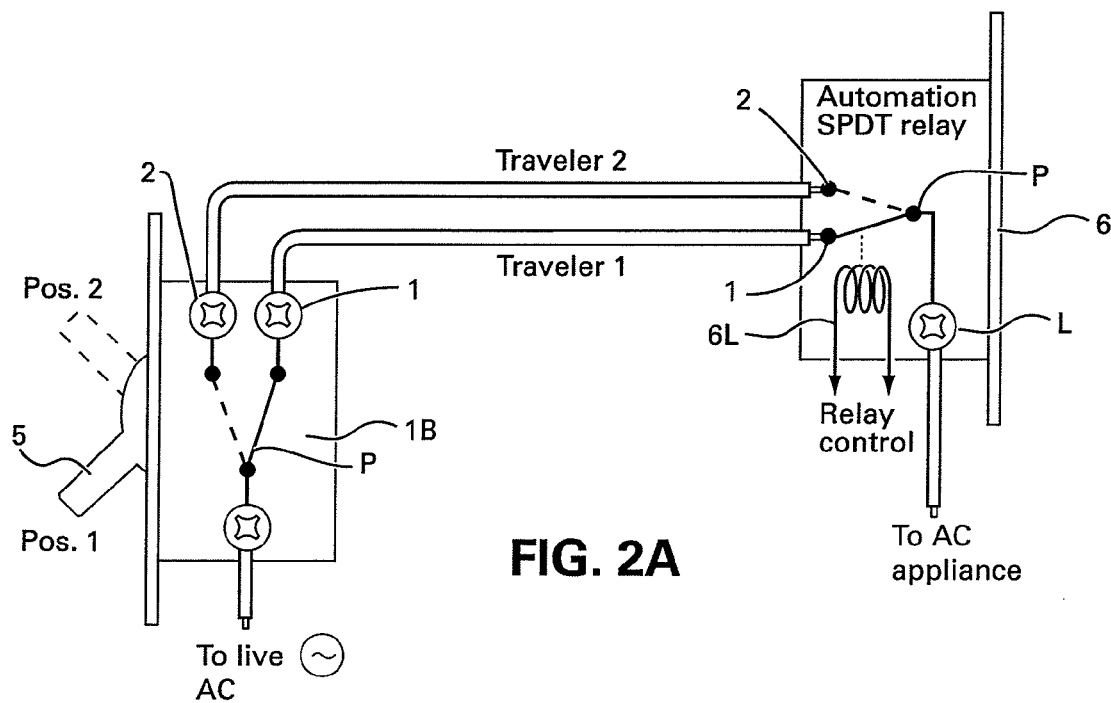
FIGS. 2A~2C are electrical drawing, connections and illustrations of SPDT and DPDT switches including the interconnections of SPDT relay of the present invention with SPDT switch.

The importance of this setup is that the on or off state of either switch lever 5 is not defined. This is why the positions of lever 5 shown in FIGS. 1B, 1D and 2A are not termed on or off, but as position 1 (Pos. 1) and position 2 (Pos. 2). This inability to have defined on-off state of the two SPDT switches or an SPDT switch and SDPT relay shown in FIG. 2A and as will be explained below, the combined two SPDT and multi DPDT switches or the two SPDT and a DPDT relay 6C shown in FIG. 3A, call for a solution for providing on-off status to the controller of the electrical systems of home automation.

Figure 2B:
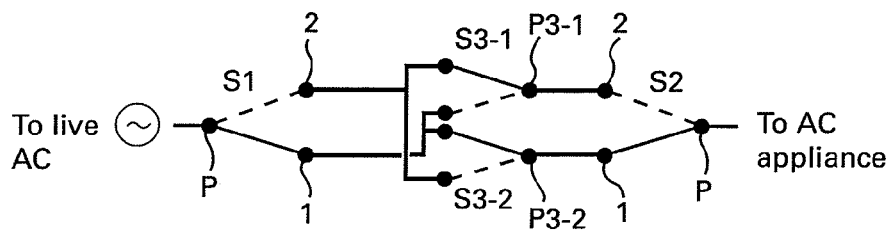

FIG. 2B shows an extended electrical circuit wherein a double pole-double throw (DPDT) switch S3-1 and S3-2 is introduced in between the two SPDT switches S1 and S2 of FIG. 1C by intersecting the traveler 1 and traveler 2 lines. The significance of the DPDT switch S3-1 and S3-2, shown also in FIG. 2C as DPDT switch 1C is that its double throw positions do not switch off the traveler lines. The DPDT switch 1C connects the traveler's lines 1 and 2 straight with the lever 5C in Pos. 1 and crosses the traveler's lines 1 and 2 when the lever 5C is switched to Pos. 2. Such dual throw switch setup, for connecting the traveler lines straight or cross (reverse) causes by reversing the traveler lines to break or make the continuity of the electrical circuit and thereby switches the appliance from off state to on state or in reverse switches the appliance from on state to off state.

Figure 2C:
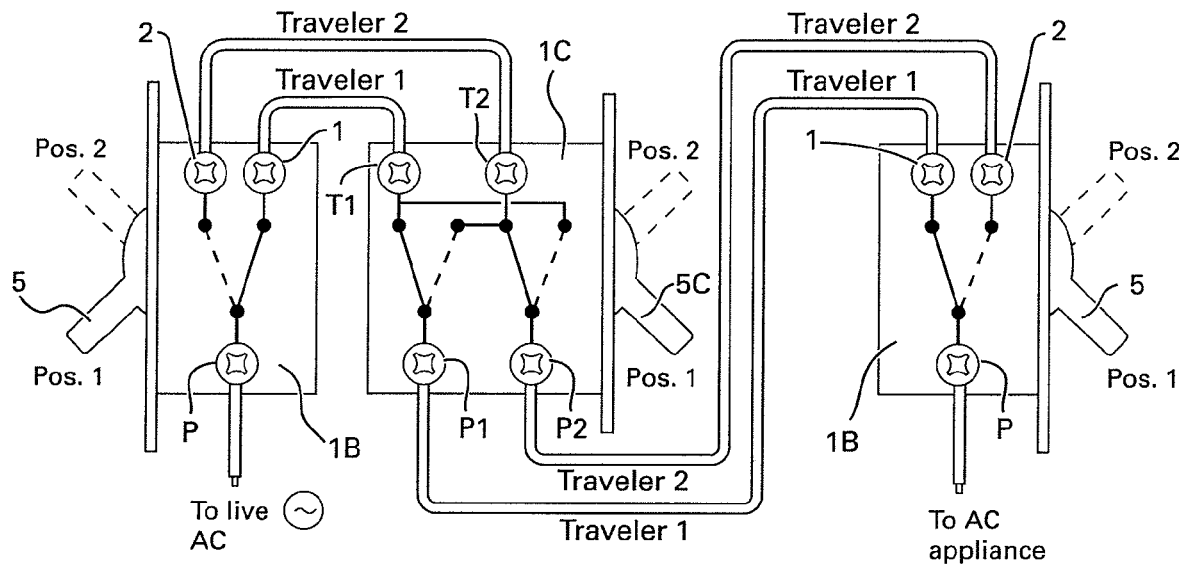
Figure 3A:
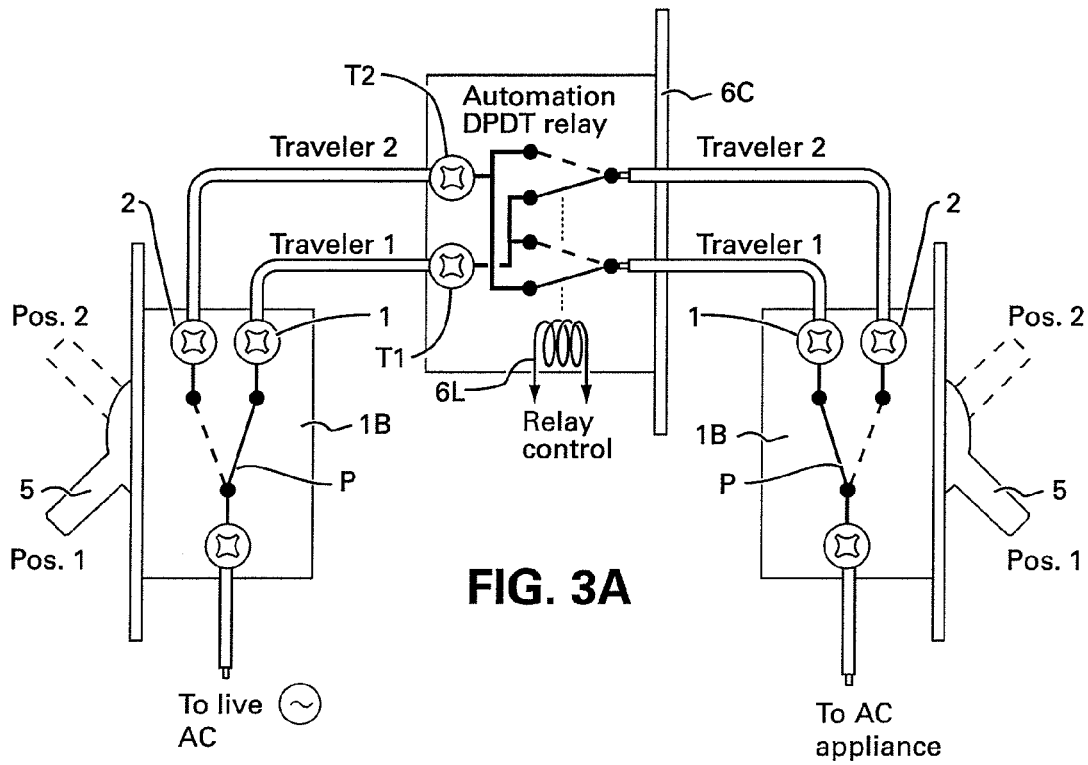
FIGS. 3A~3C are electrical drawing, and connections of two SPDT switches with two DPDT switches and with DPDT relay and the interconnection of SPDT switches with DPDT relay of the present invention.

The DPDT switches 1C shown in FIG. 2C used in a cascading switches setup and the DPDT relay 6C of the present invention shown in FIG. 3A are connected between the traveler's terminals 1 and 2 of two SPDT switches 1B, such that when the switch lever 5C is in Pos. 1 shown in FIG. 2C the traveler lines 1 and 2 are connected in straight line, and when the switch lever 5C is switched to Pos. 2 (dashed line), the travelers lines 1 and 2 are crossed (reversed).

Figure 3B:
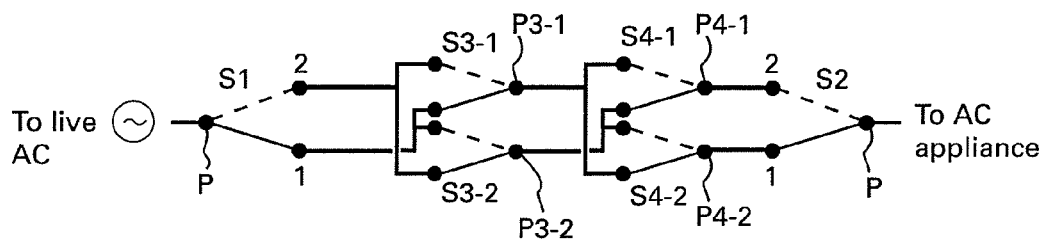

As shown in FIG. 3B it is possible to add n number of DPDT switches to the cascading switches chain and operate the appliance independently, from each one of the two SPDT switches and from an n number of DPDT switches. The cascaded switches' setup shown in FIG. 3B comprises four switches, two SPDT switches S1 and S2 and two SPDT S3-1/S3-2 and S4-1/S4-2. As the DPDT switches never cut, but crosses the traveler lines, it is clear from the circuit 3B that the terminal 1 and 2 of both switches S1 and S2 will always be connected, be it straight or crossed. By this arrangement therefore, regardless of how many DPDT switches are introduced in the cascaded switches chain, each of the switches will independently switch on-off the appliance connected to the chain.

Figure 3C:
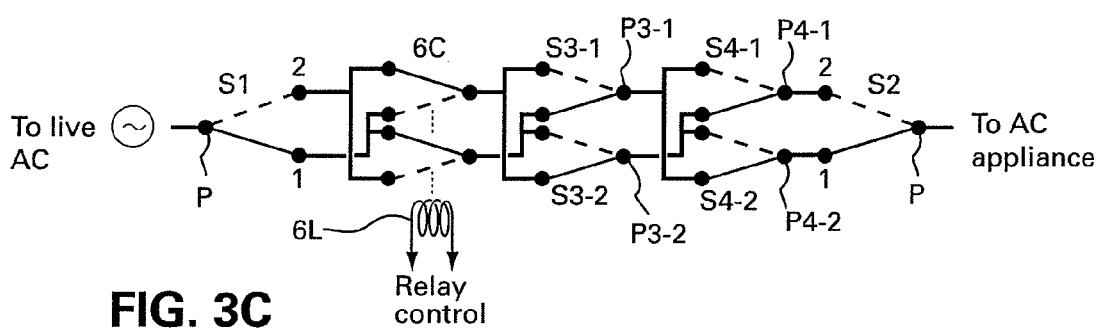

As can be seen in FIG. 3A and FIG. 3B the switching over of SPDT switches to the opposite position (Pos. 1 to Pos. 2 or vice versa), or the re connecting the traveler lines 1 and 2 from straight to cross or from cross to straight, by the DPDT switch 1C or the DPDT relay 6C of FIG. 3A or 6C of FIG. 3C independently, will make or break the AC circuit and will switch the appliance on and off independently and regardless of the other switches' lever positions.

Shown in FIG. 3C is the relay 6C of the present invention and as explained above, the introduction of additional DPDT switch or relay into the cascading switches shown in FIG. 3B does not change the switching capacity of each individual switch or relay to switch on-off the connected appliance. One major advantage of the present invention as will be explained later, is that only a single relay that is introduced into the cascading switches is needed to fully connect the cascaded switches chain into the home automation system.

The introduction of a DPDT relay into a cascading switches arrangement makes it clear that there is no way to verify the status of each individual mechanical switch. Moreover, because of the need to remotely operate the appliances without error, the issue of the on-off status of the appliance is critical, because the operator must know the status of the appliance he operates and preferably the status of the whole electrical system of the home, apartment, office or building.

Building can be any constructed workshop, factory, warehouse, garage, stadium, hall, studio, theater and any other private, public or business building, manufacturing building, storage building and/or other structure incorporating electrical appliances such as air conditioners, light fixtures and other AC operated appliances.

FIG. 4A is an illustration showing the add on SPDT relay 6 connected via the two travelers lines 1 and 2 to the traveler terminals T1 and T2 of a standard SPDT switch 1B and with its load terminal L connected to the AC appliance, the same way as shown in the electrical circuit of FIG. 2A. FIG. 4B illustrates the connection of DPDT relay 6C with the SPDT switch 1B. The DPDT relay's 6C two traveler wires 1 and 2 are connected to the two traveler terminals of the SPDT switch 1B shown also in FIG. 3A and with the two traveler wires 1 and 2 connected to the terminals T1 and T2, which are the poles of the dual pole relay. From the relay 6C the two travelers are fed through the electrical wall box 14 to the next cascading DPDT or SPDT switch (not shown). It become obvious from FIGS. 4A and 4B that it is simple to add such SPDT relay 6 or DPDT relay 6C to the standard electrical SPDT switches, instead of replacing the whole switching system as used in other current home automation systems for remote switching of appliances.

Figure 11A:
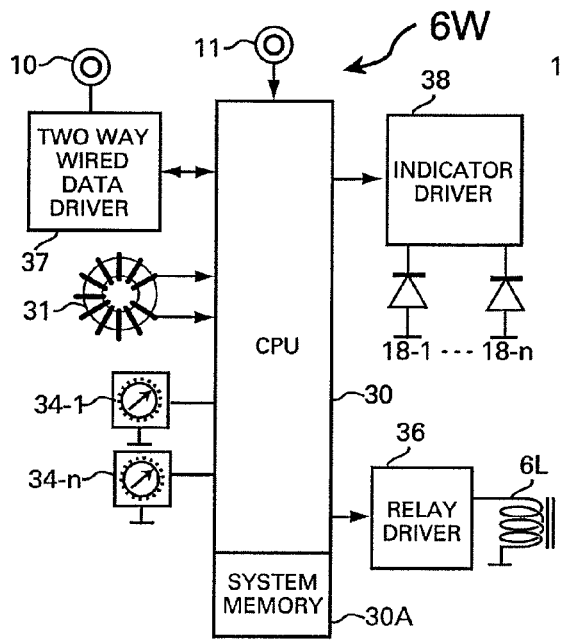
FIGS. 11A~11D are block diagrams of the relay control and communication circuits including the current sensor of the preferred embodiment of the present invention.
Figure 11B:
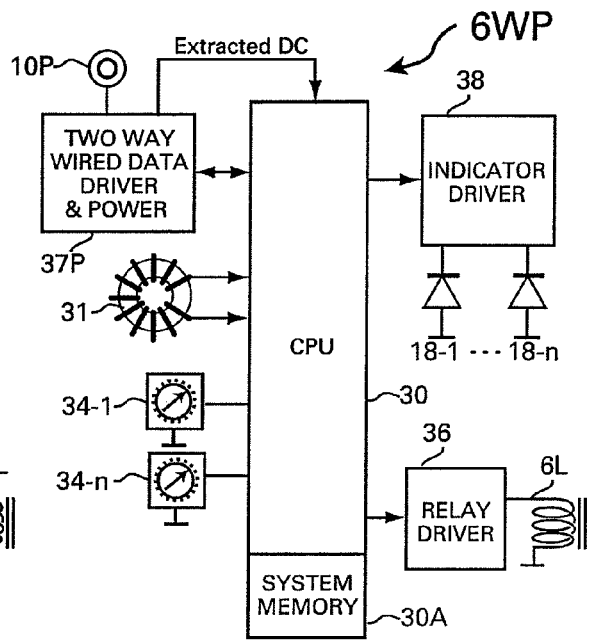

The relays 6 and 6C shown in FIGS. 4A and 4B are controlled through a wired communication network via the terminal 10P that carries the DC power for powering the control 30 via a single twisted pair, the communication and power extracting circuit 37P, the indicators driver 38 and the relay driver 36 circuits shown in FIG. 11B. The relay control and communication circuit 6WP will be described in further details later. Accordingly the relays 6 and 6C that are powered via the communication network line are commanded to switch over the relay 6 contacts or to connect the traveler lines straight or cross through the relay 6C contacts. In systems that the wired communication lines cannot carry or feed the DC power, the relay control and communication circuit 6W shown in FIG. 11A will be used instead. For the power connection, the relay control and communication circuit 6W uses separate terminals or connector, shown as terminal 11 in FIG. 11A. Such connector or terminals are not shown in FIGS. 4A and 4B, but are shown in FIGS. 5A, 5B, 6A and 6B. In the following description the "relays series 6" refers to any and all of the relays of the present invention, as described.

Figure 5A:
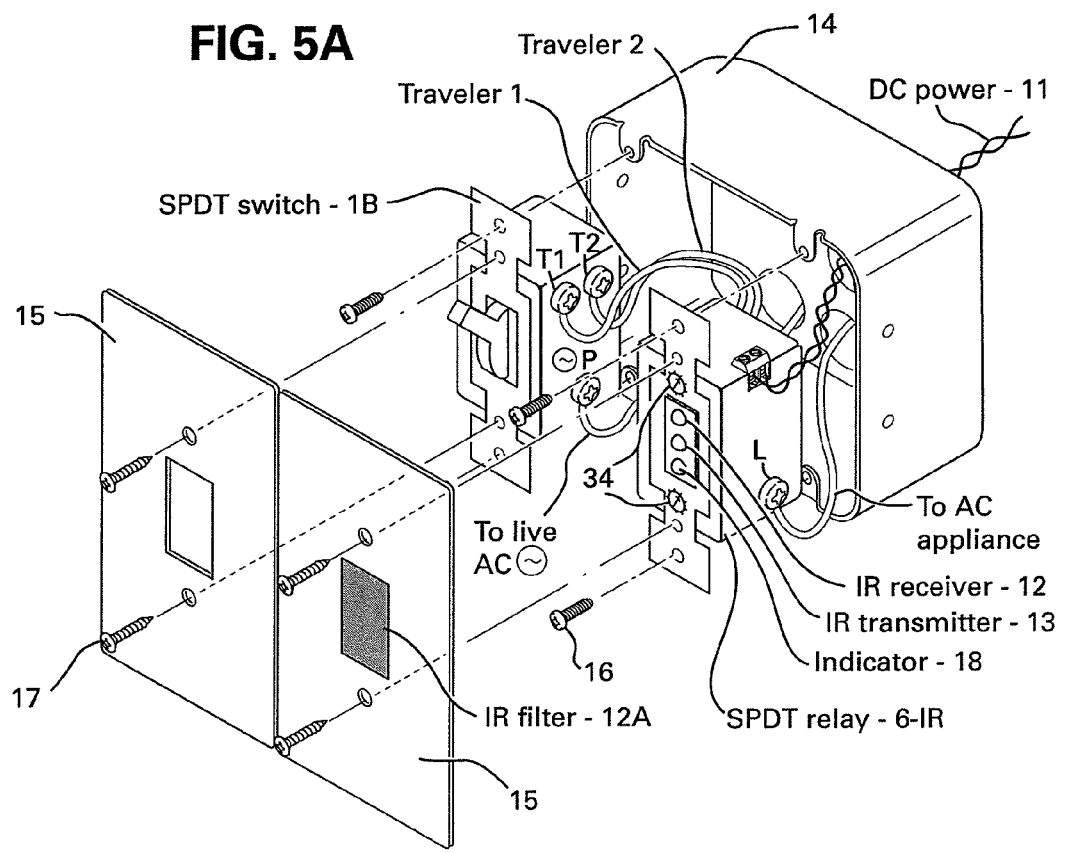
FIGS. 5A and 5B are exploded views showing the installation and the connections of SPDT switch with SPDT and DPDT relay of the present invention, operated via IR remote control network.
Figure 5B:
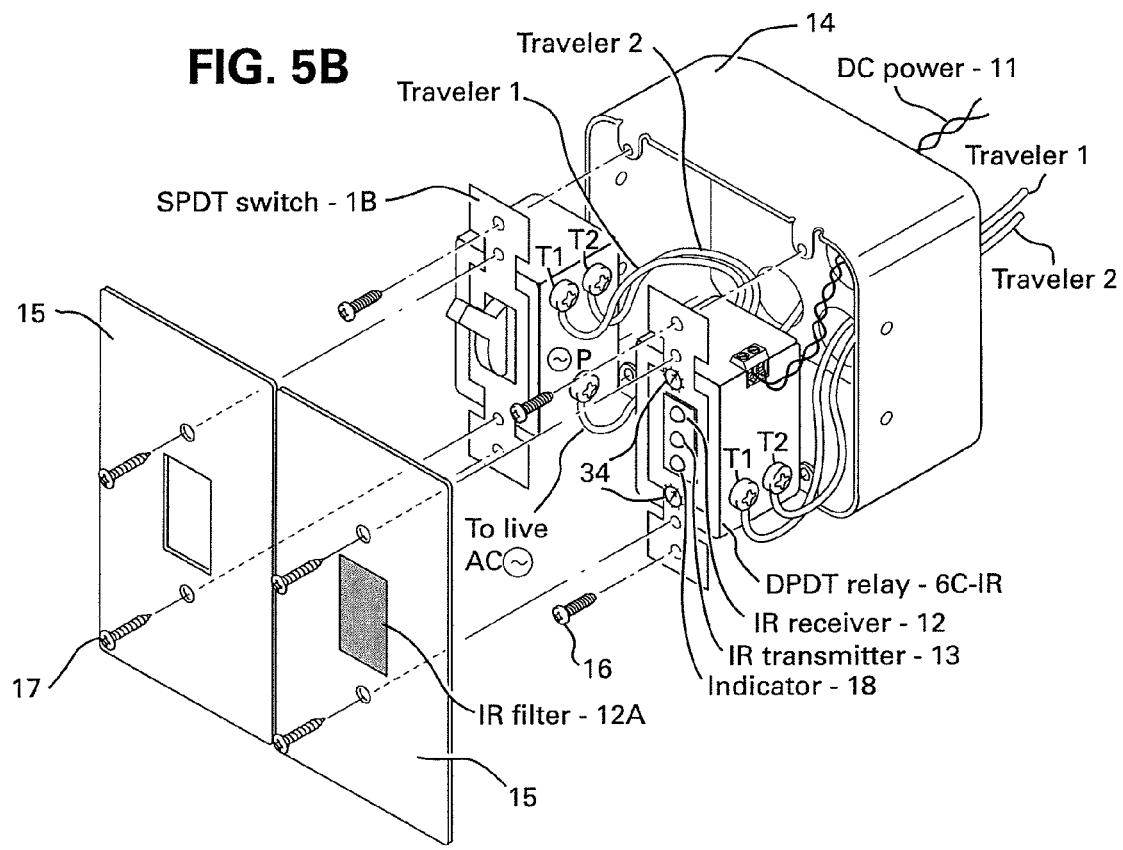

FIGS. 5A and 5B show the relays 6-IR and 6C-IR that are identical in their electrical switching to the relays 6 and 6C of FIGS. 4A and 4B. The difference is in the control and communicator circuit 6IR of FIG. 11D. As shown in FIG. 11D the wired communication circuits 37 or 37P are replaced with an IR TX and LPF circuit 32 and with IR TX driver circuit 33 for providing two way IR communication for operating the relays 6-IR and 6C-IR. The control and communicator 6IR is powered via terminals or connector 11, it can be connected in cascading chain with other relay units to a master power supply such as the power supply portion of the communication driver and power supply 60IR shown in FIG. 13B, or it can be powered individually by a given power supply, or by a battery or by a rechargeable battery and the like.

Figure 6A:
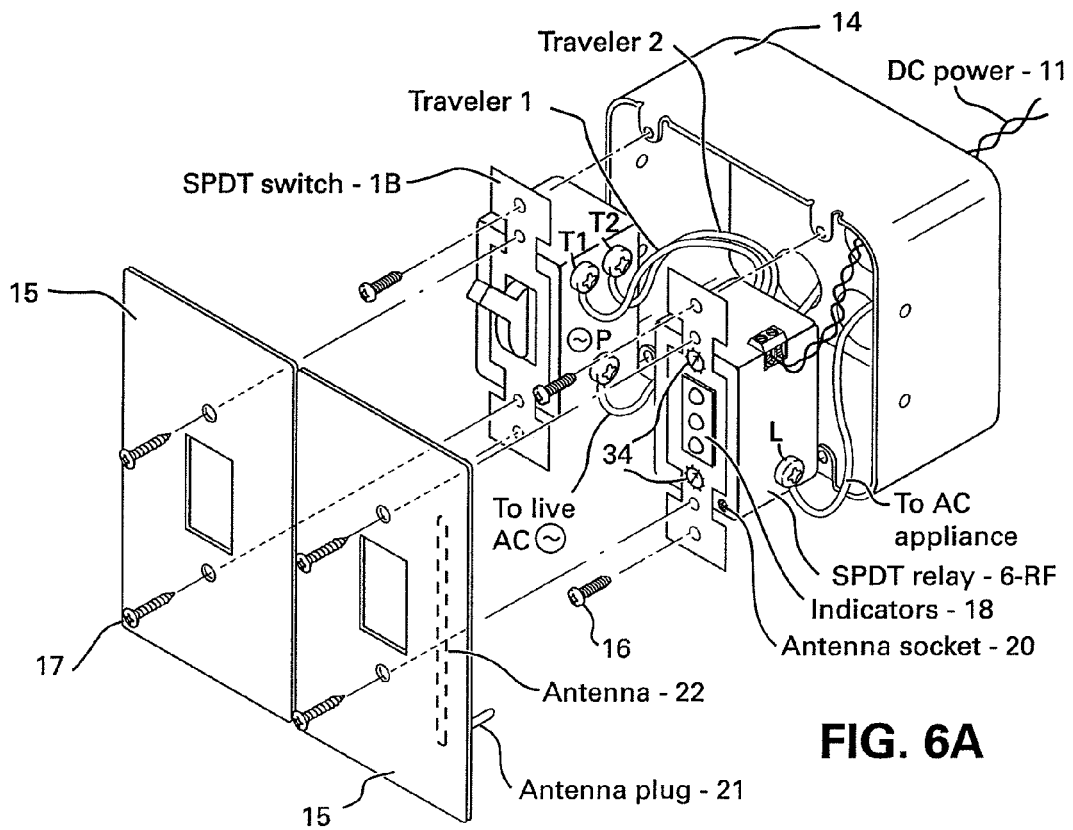
FIGS. 6A and 6B are exploded views showing the installation and connections of SPDT switch with SPDT and DPDT relay of the present invention, operated via wireless network.
Figure 6B:
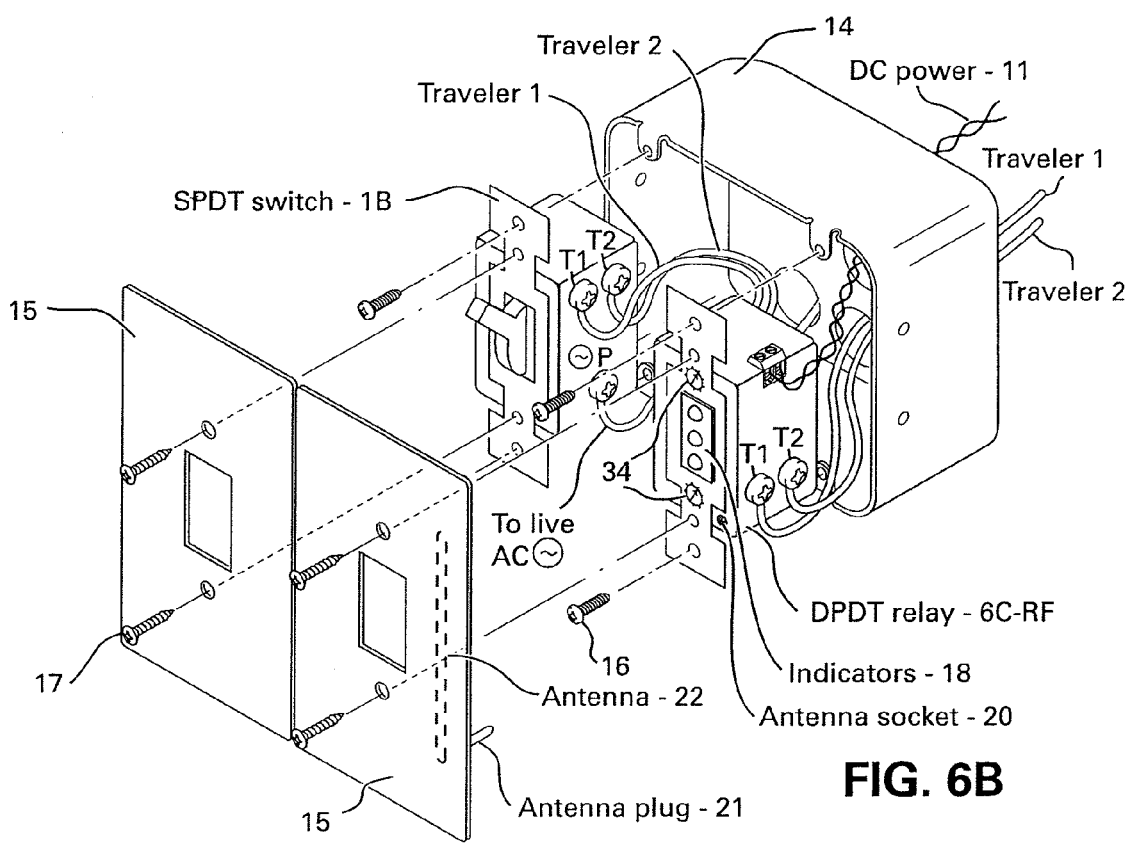
Figure 11C:
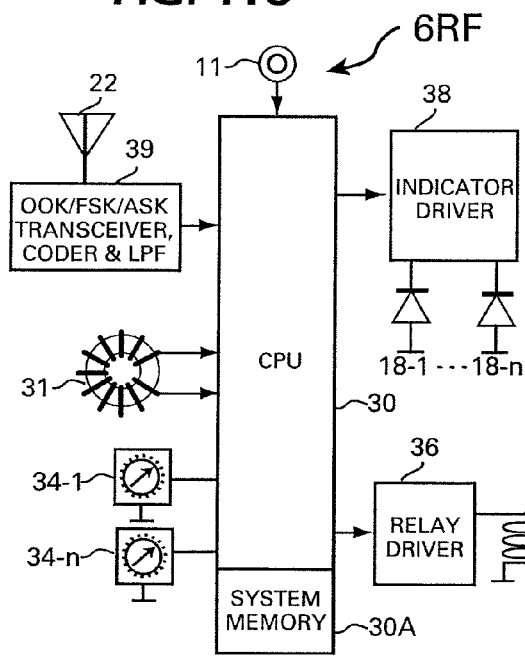
Figure 11D:
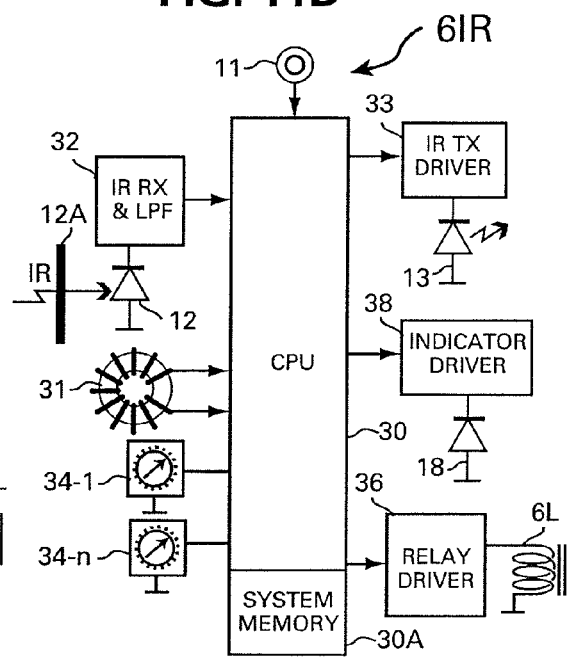

FIGS. 6A and 6B show the relays 6-RF and 6C-RF that are identical with the relays 6-IR and 6C-IR shown in FIGS. 5A and 5B, with the exception of the communication circuit 39 of the control and communicator 6RF shown in FIG. 11C.

The relays 6-RF and 6C-RF communicate via RF wireless network through the transceiver, coder and LPF circuit 39 and through the antenna 22 shown as attached to the plastic cover 15 that is used for covering the relays 6-RF or 6C-RF that are installed into a standard electrical box 14. The antenna 22 is connected to the antenna socket 20 of the relay 6-RF or 6C-RF using the antenna plug 21 shown in FIGS. 6A and 6B. It becomes clear from the illustrated and explained circuits that the SPDT relays 6, 6-IR and 6-RF and that the DPDT relays 6C, 6C-IR and 6C-RF can be connected to standard SPDT electrical switches and to a cascading commonly used SPDT or SPDT and DPDT electrical switches via travelers lines and remotely switch the appliances on off, by switching over the pole position of the SPDT relays and/or connecting straight or cross the traveler lines by the DPDT relays. It is also clear that the relays can be controlled via communication lines including wired network, IR network and RF network and that the relays are constructed in sizes that fit standard electrical wall boxes and can be mounted next to the commonly used AC switches. It is also clear that the relays series 6 can be covered by identical switch cover that fits the switches frame, shape, cover color, design and the like.

The relays and their control and communication circuits and indicators can be powered via a cascading wired single twisted pair communication lines 10P, or separately via power supply line 11 using individual power adaptors, via batteries or rechargeable batteries and/or by any other commonly available AC/DC supply options.

The use of the SPDT relay 6, 6-IR or 6-RF and the DPDT relay 6C, 6C-IR or 6C-RF however, can not provide verifiable data as to the appliance on-off status. The relays 6, 6-IR and 6-RF and 6C, 6C-IR and 6C-RF are therefore are preferably used in limited applications, such as in small locally controlled systems such as apartments, offices or houses that the operator of the system can verify on site if the lights or the air condition are switched on or off, etc, but such home automation system will be unreliable if the user of the system need to remotely control appliances from far, such as through the Internet.

Figure 7A:
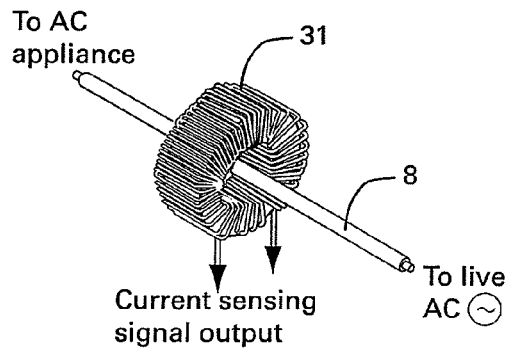
FIGS. 7A~7E are electrical drawing and illustrations of the current sensing coils and structures and the preferred embodiment of the current sensors and the connections to an AC outlet of the present invention.
Figure 7B:
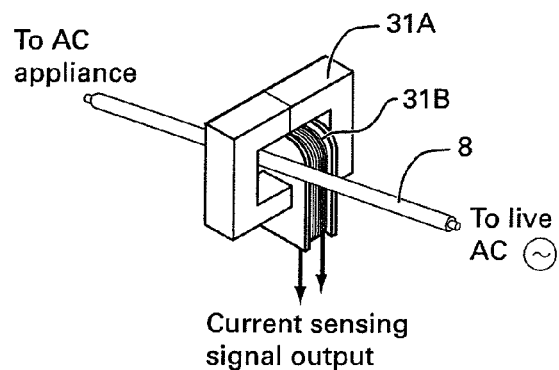
Figure 7C:
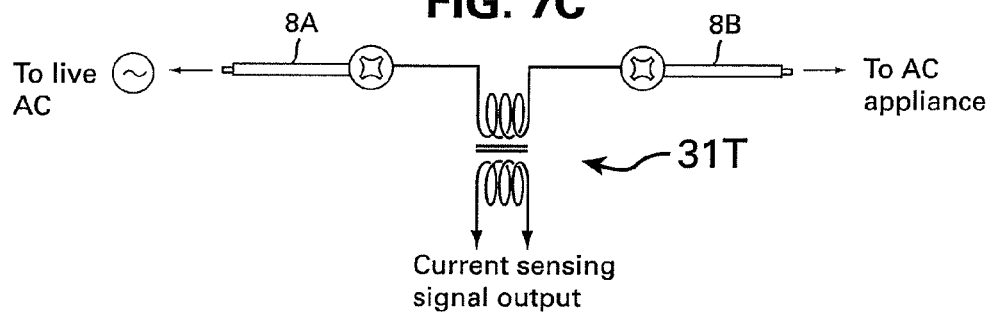

FIGS. 7A, 7B and 7C show current sensing coils and transformer. The well known toroidal coil 31 of FIG. 7A can provide passage through its ring to an AC current carrying wire 8 for generating an AC output signal by induction, outputting a voltage level relative to the current drain through the wire 8.

The coil assembly shown in FIG. 7B combines well known ferrite "C" core 31A and a coil 31B and provide passage as shown in FIG. 7B for the AC current carrying wire 8. Similar to the toroidal coil 31, the coil 31B will output by induction an AC output signal relative to the current drain in the wire 8. While both the toroidal coil 31 and the coil 31B with its core 31A perform the same function, i.e., generate by induction an output signal, relative to the current drain in the wire 8, the advantage of the toroidal coil 31 is in its simple structure. The winding of toroidal coil however are costlier and with smaller toroidal core the number of winding is limited, thereby the sensing signal level is smaller, resulting in lower signal to noise ratio, which may cause current detection errors.

The coil assembly 31B with its "C" core 31A shown in FIG. 7B can have substantial more winding, sufficient to output higher AC signals in response to current flow through wire 8, having good signal to noise ratio and signal levels that can be processed and measured by the CPU 30 of the control circuits 6W, 6WP, 6RF and 6IR, shown in FIGS. 11A~11D without sensing errors.

Another current sensor that can be used is the current transformer 31T shown in FIG. 7C. The current transformer 31T actually connects to live AC line, be it through the Load terminal L or the direct live terminal P of the SPDT switch. Such current transformer offer best signal to noise ratio and can output large, accurate signal output. However such introduction of AC current transformer mandates connection to live AC line, which is governed by regulations, structure limitations, testing and approvals, which defeats the present invention that seeks to simplify the introduction of home automation relays system with minimal direct exposure to live AC power line.

Regardless, using the AC current transformer 31T in between two structured, tested and certified live AC line terminals, shown in FIG. 7C as line 8A and line 8B can be used with the present invention for incorporating the current sensor output with the control and communication circuits 6W, 6WP, 6RF and 6IR shown in FIGS. 11A~11D.

The relay control and communication circuits are all shown in FIGS. 11A-11D with the toroidal coil 31, because with proper amplification and hum canceling program the CPU 30 of the control circuit can reliably operate and identify the current drain through the AC wire 8 passing through the toroidal 31 core. However the "C" core 31A with its coil 31B, and as explained above, the current transformer 31T or any other structured coil assembly that can generate output signal in response to current drain in wires 8, 8A or 8B shown in FIGS. 7A~7E can be used instead.

Since both the SPDT and the DPDT relays are connected to dual traveler lines with only one of which may drain the AC current, it is possible to use a passage through a coil for the two traveler electrical wires. Such larger passage will either reduce the sensing sensitivity or will increase the coil size substantially. Alternatively, it is possible to provide two current sensing coils, one for each traveler but which will increase the cost of the device. In all cases since only one relay is needed and introduced into the cascading switches, the single wire feeding the AC live line or the single wire leading to the AC live terminal of the appliance is the preferred embodiment of the present invention for the current sensor.

Figure 7D:
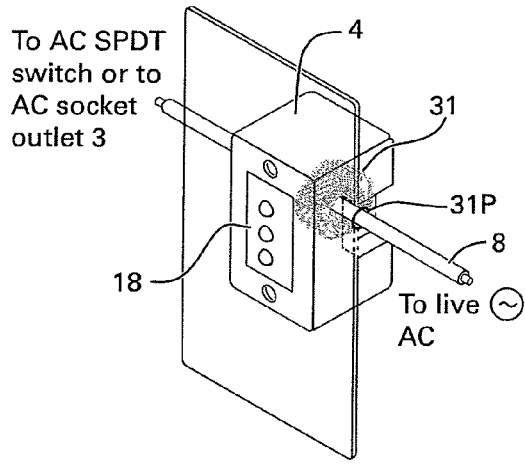

FIG. 7D shows a current sensor and communicator unit 4, that is also termed hereafter as an AC outlet or as "outlets series 4", having a passage through its plastic constructed body, that is fully insulated from AC live lines and/or AC live terminals, for providing a fully insulated passage for an heavy gauged insulated standard electric wire 8 through the incorporated current sensing coil, shown as toroidal coil 31. The built in control and communication circuit for the current sensor and communicator 4 of the outlets series 4 is identical with the circuits 6W, 6WP, 6RF and 6IR shown in FIGS. 11A~11D, with the exception of the relay driver, which is not used. All other circuits including the indicator driver circuit 38 are used. As shown in FIG. 7D the current sensor and communicator unit 4 includes indicators for indicating the current passing status.

Figure 7E:
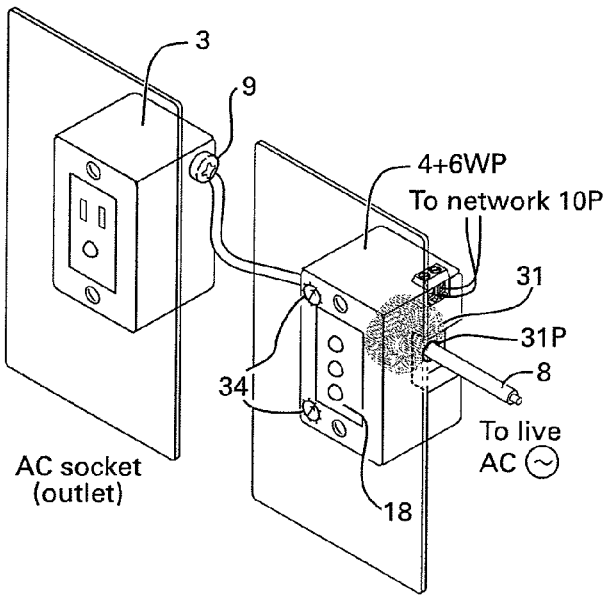

FIG. 7E shows a practical simple use of the current sensor and communicator unit 4 in the home automation system, wherein the live AC wire passing through the coil 31 of the current sensor and communicator 4+6WP is connected to a standard AC outlet 3 through the outlet live terminal 9. By such simple interconnection the current sensor and communicator 4+6WP can accurately indicate through the indicators 18 when the status of AC appliance that is powered via the AC outlet 3 is on or off. Further the current sensor and communicator 4+6WP communicates the on or off status to the home automation controller, or the video interphone or the shopping terminal of the home automation system, via the network 10P or via the network 10 for the AC outlet 4+6W, or via the IR or RF network by the AC outlets 4+6IR and 4+6RF, as the case may be.

Figure 8A:
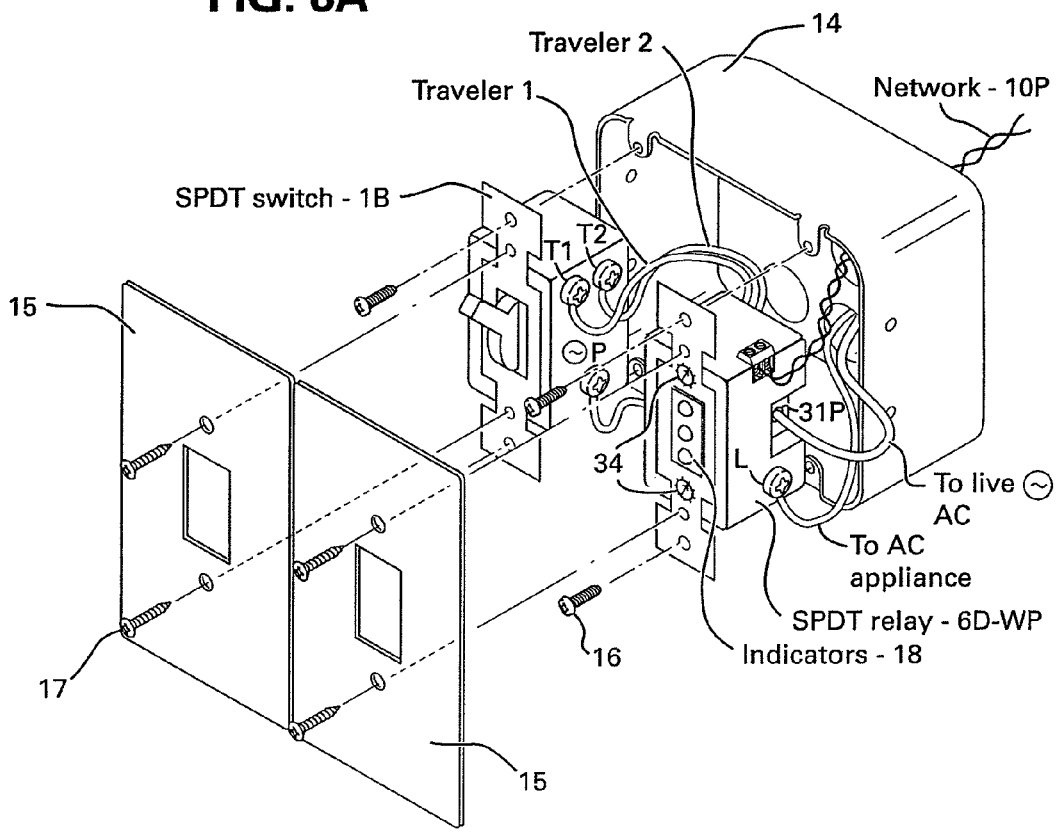
FIGS. 8A and 8B are the exploded views of FIGS. 4A and 4B incorporating the AC lines passages through the current sensors of the preferred embodiment.
Figure 8B:
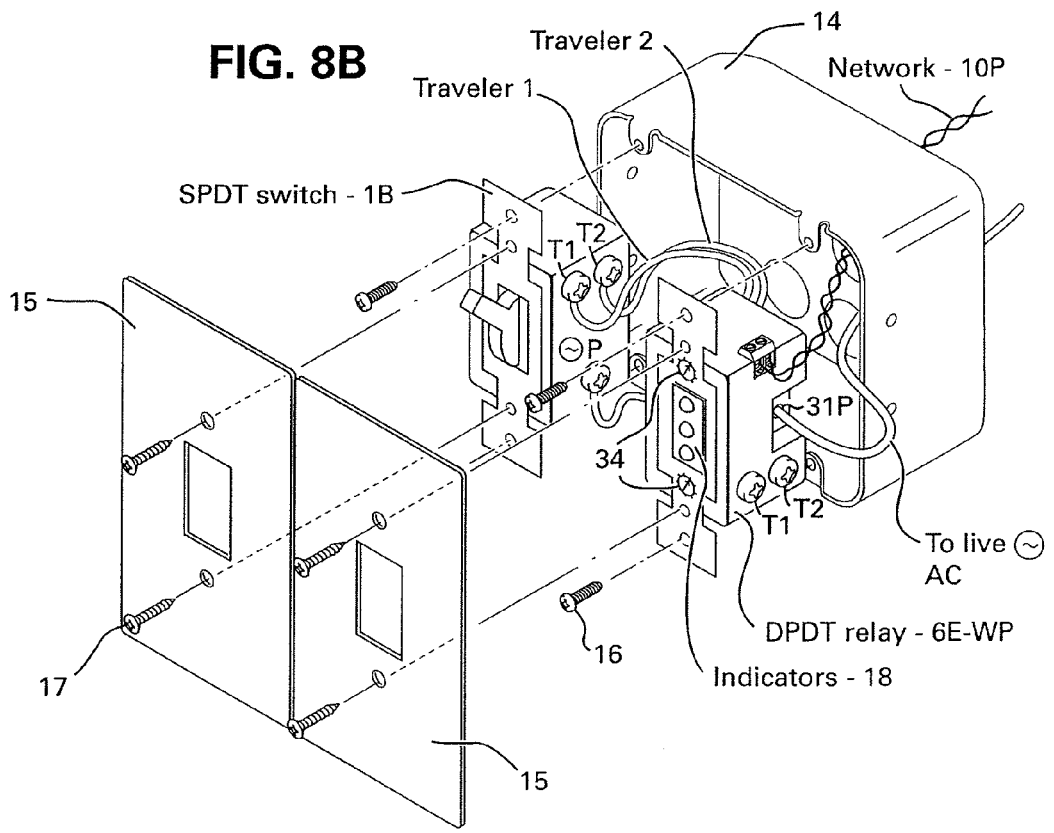

The relays 6D-WP and 6E-WP shown in FIGS. 8A and 8B are controlled through a wired communication network via the terminal 10P that carries the DC power for powering the control and communicator circuit 6WP. Similar to the relays 6-WP and 6C-WP shown in FIGS. 4A and 4B the relay 6D-WP and 6E-WP are connected and operated the same way, with the exception of the passing of a live insulated AC power wire through an insulated passage 31P and through the current sensing coil (not shown), but which is same as the coil 31 passage shown in FIG. 7E. By this the on-off status of the connected appliance can be communicated to the main controller via the network 10P. As explained above, in systems that the wired communication lines cannot carry or feed the DC power, the relay control and communication circuit 6W shown in FIG. 11A will be used instead. For power connection the relay control and communication circuit 6W uses separate connector, shown as a connector or terminal 11 in FIG. 11A. The connector or terminal 11 is not shown in FIGS. 8A and 8B, but is shown in FIGS. 9A, 9B, 10A and 10B.

Figure 9A:
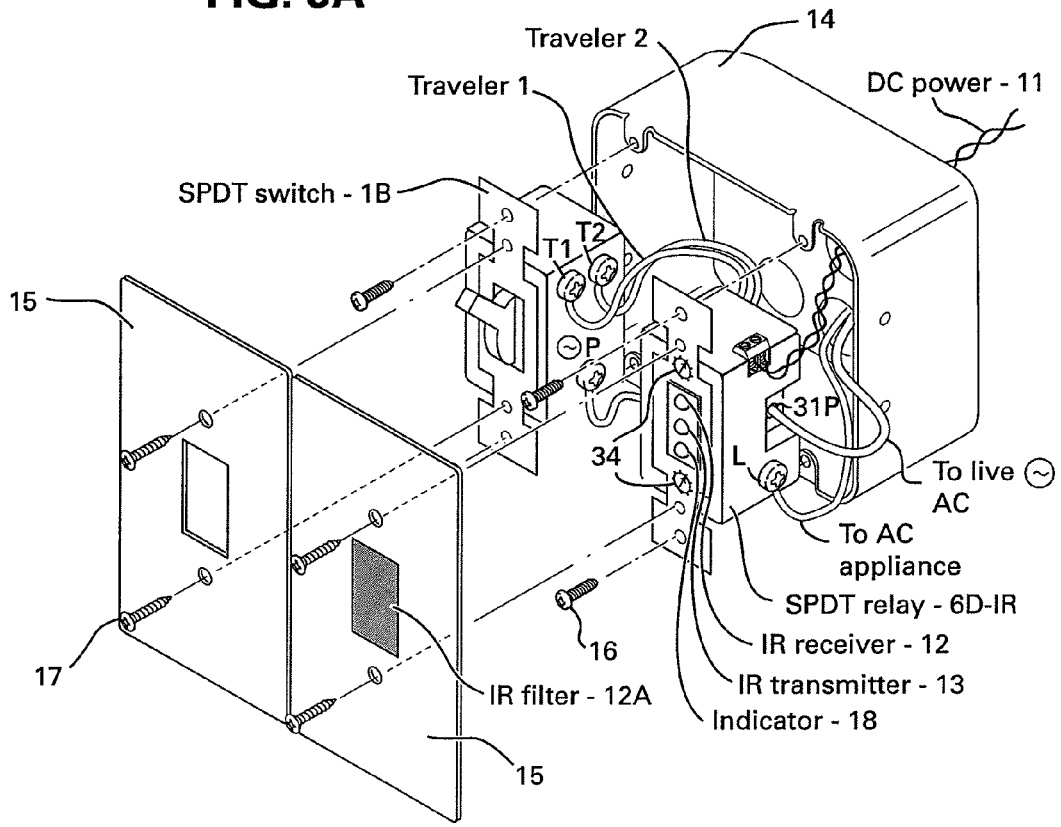
FIGS. 9A and 9B are the exploded views of FIGS. 5A and 5B incorporating the AC lines passages through the current sensors of the preferred embodiment.
Figure 9B:
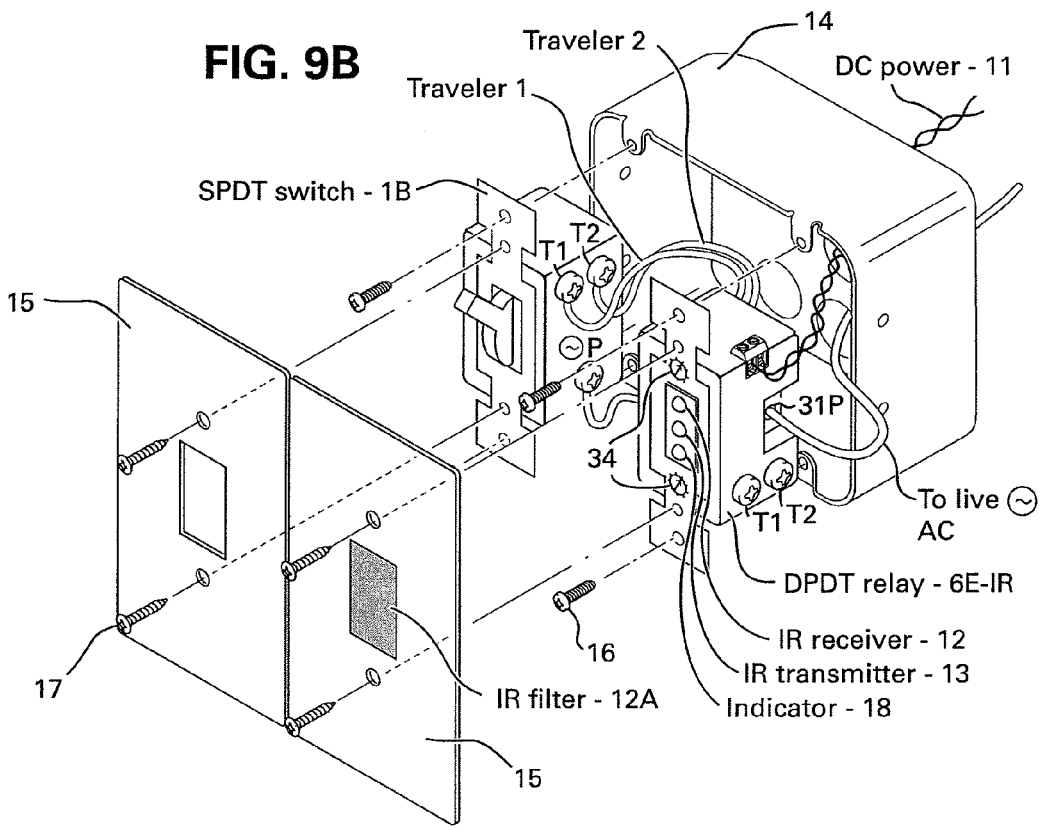

Outside the power terminal 11, FIGS. 9A and 9B show the relays 6D-IR and 6E-IR that are identical in their electrical switching and current sensing to the relays 6D-WP and 6E-WP of FIGS. 8A and 8B. The main difference is in the control and communication circuit 6IR of FIG. 11D. As shown in FIG. 11D the wired communication circuits 37 or 37P are replaced with an IR TX and LPF circuit 32 and with IR TX driver circuit 33 for providing two way IR communication for operating the relays 6D-IR and 6E-IR and for generating on-off status pertaining the connected appliance. The control and communication circuit 6IR is powered via terminals or connector 11 that can be connected in cascading chain with other relays series 6 to a master power supply such as the power supply connector or terminals 68-11 of the power supply circuit 68 of the communication driver and power supply 60IR shown in FIG. 13B, or it can be powered individually by a given power supply or by an AC adaptor, or by a battery or by a rechargeable battery and the like.

Figure 10A:
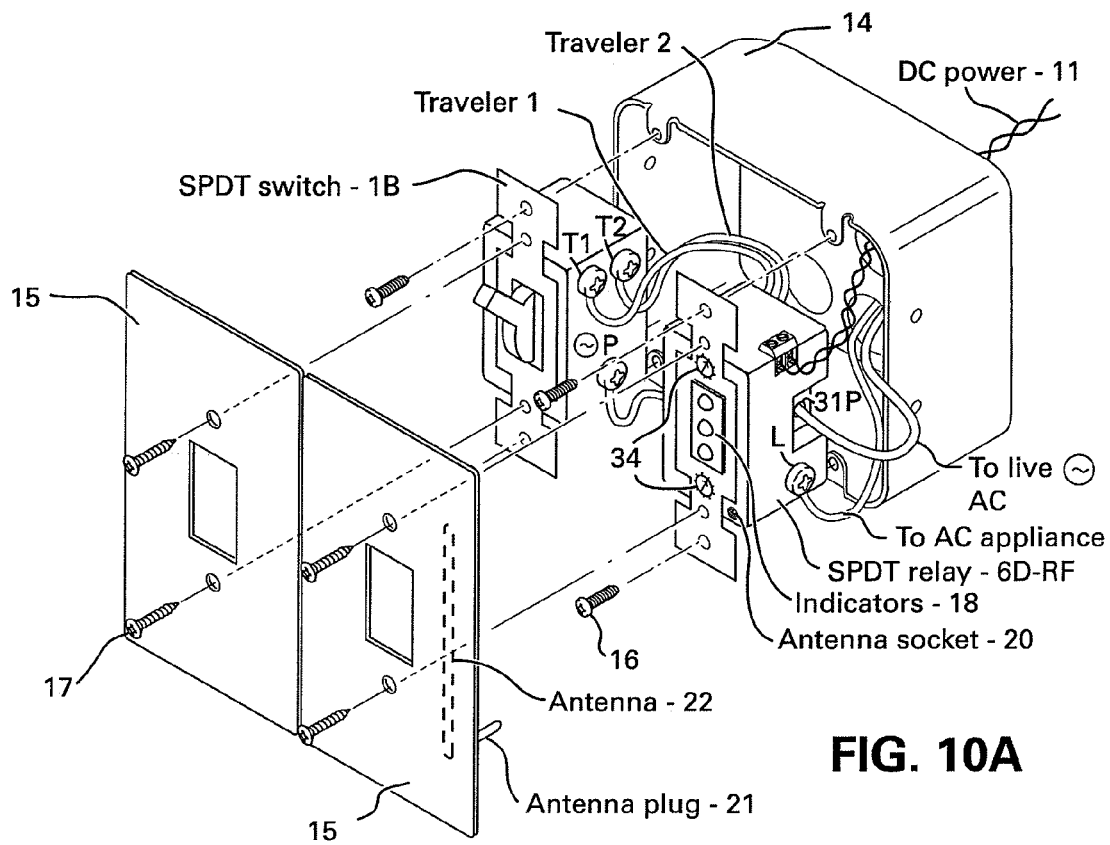
FIGS. 10A and 10B are the exploded views of FIGS. 6A and 6B incorporating the AC lines passages through the current sensors of the preferred embodiment.
Figure 10B:
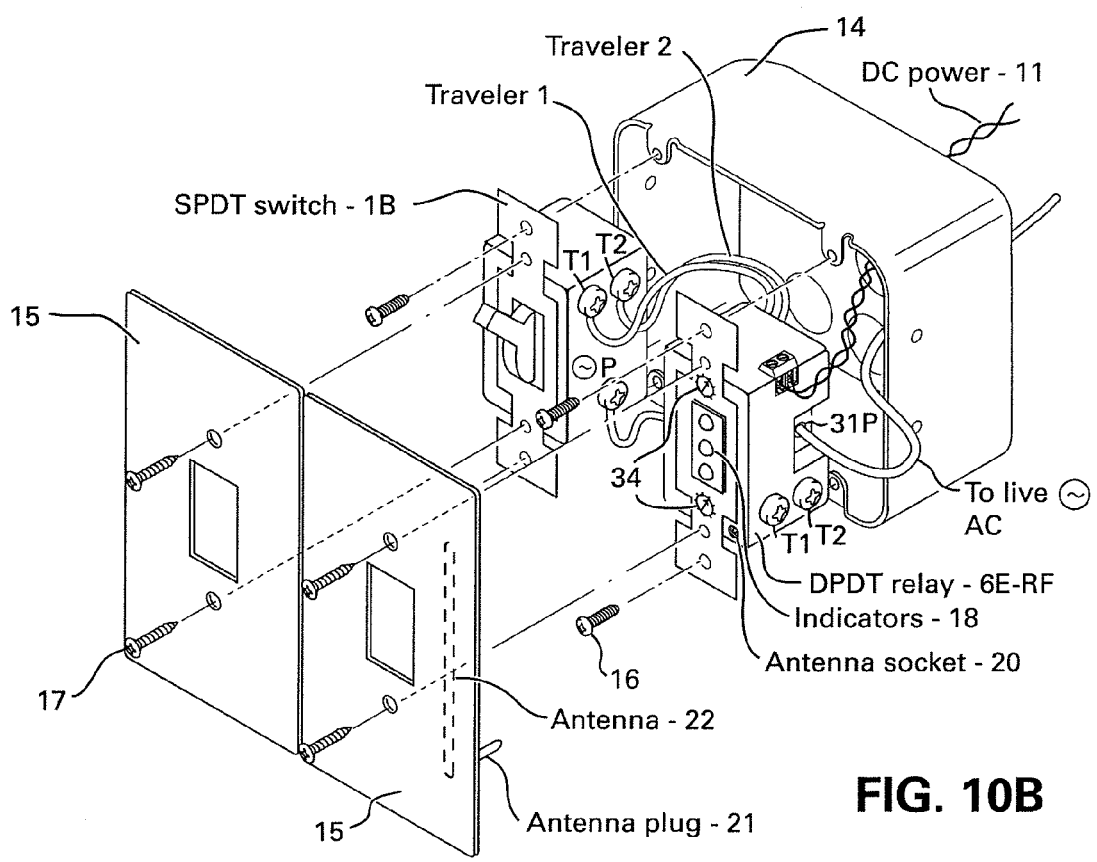

FIGS. 10A and 10B show the relays 6D-RF and 6E-RF that are identical with the relays 6D-IR and 6E-IR shown in FIGS. 9A and 9B, with the exception of the communication circuit 39 of the control and communication circuit 6RF shown in FIG. 11C.

The relays 6D-RF and 6E-RF communicate via RF wireless network through the transceiver, coder and LPF circuit 39 and through the antenna 22 shown as attached to the plastic cover 15 that is used for covering the relays 6D-RF or 6E-RF that are installed into a standard electrical box 14. The antenna 22 is connected to the antenna socket 20 of the relay 6D-RF or 6E-RF using the antenna plug 21 shown in FIGS. 10A and 10B. It becomes clear from the illustrated and explained circuits that the SPDT relays 6D-W, 6D-WP, 6D-IR and 6D-RF and that the DPDT relays 6E-W, 6E-WP, 6E-IR and 6E-RF can be connected to a commonly used SPDT electrical switches and to a cascading commonly used SPDT or SPDT and DPDT electrical switches via travelers lines and remotely switch the appliances on off, by switching over the pole position of the SPDT relays and/or connecting straight or cross (reversing) the traveler lines by the DPDT relays.

It is also clear that the relays series 6 can be controlled via communication lines including wired network, IR network and RF network and that the relays series 6 are constructed in shape and sizes that fit standard electrical wall boxes and can be mounted next to standard size switches, covered by identical switch cover that fits the switches frame, shape, cover color, design and the like. Moreover, the common wiring used in homes and buildings with only two wires for the on-off switching of lights and appliances can be used as is for any of the add-on relays series 6 and for the outlets series 4.

The relays and their control and communication circuits and indicators can be powered via the wired communication lines 10P, or separately via power supply terminals or connector 11 using common power supply of individual power supplies, power adaptors, via batteries or rechargeable batteries and/or by any other commonly available and well known DC supply options.

Further, according to the present invention the use of the SPDT relay 6D-W, 6D-WP, 6D-IR or 6D-RF and the DPDT relay 6E-W, 6E-WP, 6E-IR or 6E-RF can provide verifiable data as to the appliance on-off status using the current sensing coil 31 or 31A/31B or 31T or other coils. The relays 6D-W, 6D-WP, 6D-IR and 6D-RF and 6E-W, 6E-WP, 6E-IR and 6E-RF can therefore be used in unlimited applications for remotely controlling appliances in apartments, offices or houses or in any building, providing the operator of the system with verifiable on-off status and that such home automation system will be reliable for remote control of appliances from far, such as through the Internet.

The relay control and communication circuits shown in FIGS. 11A-11D include four different circuit combinations 6W, 6WP, 6RF and 6IR that are used individually with a given relay unit of the relays series 6 or the outlets series 4. The outlets series 4 do not include the relay driver 36 in any of the four outlet versions discussed 4+6W, 4+6WP, 4+6RF and 4+6IR. All the relay control and communication circuit discussed consist of the basic central processing unit (CPU) 30 that includes the shown memory 30A. All the four shown circuits provide a relay driver 36 for driving the relay's coil 6L (not used with the outlet unit series 4), indicator driver 38 for driving a single LED indicator 18 or up to n LED indicators 18-n, current sensor coil 31 and n number of digital switches 34-1 to 34-n for setting a code, an I.D or an address for each of the relays series 6 or the AC outlets series 4 of the home automation system. The code, I.D or an address can be set and stored in the non volatile system memory 30A, using well known programs such as X10, Zigbee or other well known home automation programs via the networks and the circuits connecting the networks to the CPU 30 or via a programmed PC, however the digital switches 34 are specifically shown here, to emphasize that for a simplified, easy to install and connect home automation system, the shown rotary digital switches provide error free addressing that can be set and corrected (when wrongly set) by electricians that do not command the high tech skills needed for programming of addresses.

For example, the shown digital switch 34-1 can be used for addressing a room or other given area in the house or apartment. In this example the switch 34-1 may be a rotary selector switch 1~0, and the selection of 1~9 can be the addressing of rooms or areas 1~9, while the "0" (zero) setting may be an addressing to "all" or to "none".

The other digital switch 34-n shown can be used to select appliances address from 1~9 per each addressed area and the zero setting may be for example a recall to all the appliances in the addressed room or area, for commanding all the appliances to a pre-programmed "preset", or to switch off all the appliances (in the addressed room or area).

As will be explained later, the simplicity in setting singular digit address for a room and for an appliances, with such combinations cover up to 91 appliances in a given house, apartment or office, does practically over cover the need of day to day residence and office reality. Of course if the need arises for larger selection, dual digital switches 34 can be used for example, for up to 99 rooms and areas, as well as up 99 appliances per room or area. Even though such combination provide for a total of 9801 appliances in the system, the address will be limited to only four digits.

If the home system is addressed from one central location to a whole apartment building a simple addition of up to, for example, three additional rotary switches 34 enables the addressing of up to 999 apartments, etc. As stated above, when a more complex addressing is needed, the system memory 30A can be used instead of the digital switches 34, which are not required and are not used when the addresses are programmed and stored in the memory 30A.

The preferred embodiment uses for practical reasons two rotary digital switches as explained above. The rotary switches preferably using screw driver type selector setting, are preferably accessed through the front surface of the relays series 6 or the outlets series 4, such that the electrician installing the system can see the rotary switches 34 by removing the plastic cover 15 (as shown for example in FIGS. 8A and 8B) and thus set and verify the address of each relay and outlet unit without the need to remove the relay or the outlet unit from the electrical box 14. This same simplicity in setting keypads such as the keypads 40WP, 40IL and 40RF shown in FIGS. 13A~13C and 14A, 14B, 15A and 15B, that will be explained later, only enhances the importance of the simplified address setting of the preferred embodiment of the present invention.

The communication and the power extracting circuit 37P of the relay control and communication circuit 6WP shown in FIG. 11B is a well known circuit fully explained in the referenced U.S. Pat. No. 5,923,363 for feeding power and propagating array of signals including audio, video, control, commands and alarm signals via signal transmission line. The significance of the power and signal propagation over the same transmission line is the current control circuit for feeding regulated current to the relay control and communicator 6WP. Regulated current supply ensures that no signal will be corrupted by voltage variation due to change of load, such as by the driving of the relay coil, the indicators and other load variations. The extracted DC current is fed to the central processing circuit (CPU) 30 and to all the circuits connected the CPU 30, with the CPU 30 is programmed to control the load current to a fix constant load.

The two way data comprising of the address, the on-off commands, preset commands, and other commands specifically tailored for a given appliance and the return confirmation of executed commands, on-off status, AC current levels such as sleep mode or any other AC current variation as programmed can be generated by the CPU 30 in response to commands or to inquiries.

Any type of data signal can be used, such as standard RS232, RS422, RS485, USB and any other data formats and protocols used for propagating information, control, alarm and commands via bus lines and/or other networks.

It is clear from the above that the relay control and communication circuit 6WP incorporated into the relays 6-WP, 6C-WP, 6D-WP and 6E-WP can be operated and powered via a transmission line 10P carrying DC power and two way data signal.

Figure 13A:
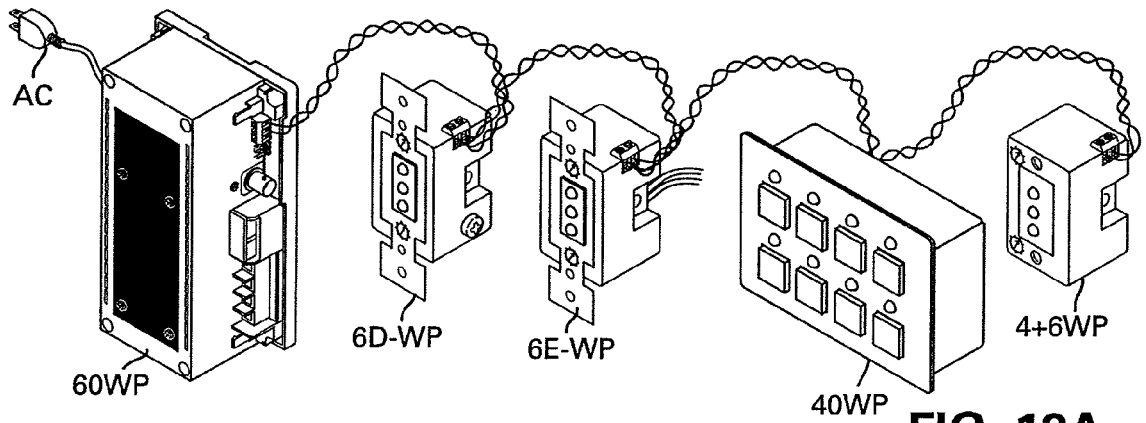
FIGS. 13A~13C are illustrations showing the communication networks for the home automation including the power supply, an IR driver and the key panel or keypad of the preferred embodiment of the present invention.

The outlet 4+6WP shown in FIG. 7E does not incorporate a relay driver 36 nor relay, and the programmed CPU 30 does not need to drive the relay in response to on-off command, that is in essence an inquiry about the AC current drain and the status of an appliance powered via an AC outlet 3, such as shown in FIG. 7E, which is fed its AC live line via the AC outlet unit 4+6WP, also shown in FIG. 13A.

The relay control and communication circuit 6W shown in FIG. 11A is identical to the relay control and communication circuit 6WP with the exception of the power supply and power feed. The terminal or connector 10 and the two way wired data driver 37 do not provide for power extracting, nor the feeding of power. Accordingly the relay control and communication circuit 6W is powered through the connector or terminal 11. As explained, many different power supplies or power sources can be used, including batteries, or rechargeable batteries. Same powering as explained for the relay units 6-W, 6C-W, 6D-W and 6E-W applies to the relays series 6 and to the outlet series 4 incorporating the relay control and communicator 6W, 6RF or 6IR that are powered via the power connector or terminal 11 as shown in FIGS. 11A, 11C and 11D.

The relay control and communication circuit 6RF is identical to 6W with the exception of the wireless transceiver 39 and its antenna 22, that replaces the two way wired data driver 37 and connector or terminal 10, shown in FIG. 11A. The OOK/FSK/ASK and other mode transceiver, coder & LPF circuit 39 that are well known circuits, provided in the market in large variety of ICs, incorporating the whole circuit on a single chip and at a low cost. Further details of such wireless transceiver circuit are explained in the referenced U.S. application Ser. Nos. 11/024,233 dated Dec. 28, 2004 and 11/509, 315 dated Aug. 24,2006.

Otherwise, the controls, commands and the propagated data using wireless network is identical with the propagated data via the wired network 10, to include on-off commands, status reply and any other data, control and commands as programmed for the wired network 10, which all can be applied and used for and by the wireless network as described above.

The relay control and communication circuit 6IR shown in FIG. 11D is similar to 6RF and 6W with the exception of the IR RX 32 with its photo diode or photo transistor 12 and the IR TX driver with its IR LED 13. As shown in FIGS. 9A and 9B the IR receiver 12 and IR transmitter 13 occupy the position of two indicators 18 provided in the relays 6D-WP, 6E-WP, 6D-RF and 6E-RF. By this the indicator 18 in FIG. 11D is shown as single indicator, but it can be multi color indicator or alternatively more indicators can be introduced to any of the relays or the outlets series of the present invention.

Otherwise the relay control and communication circuit 6IR of FIG. 11D is operating, controlling, propagating data and communicating as programmed for the wired network 10 and/or the RF wireless network described above. Of course the IR network is limited to an unobstructed optical path, and requires repeaters within the house, apartment, office or the building.

Figure 13B:
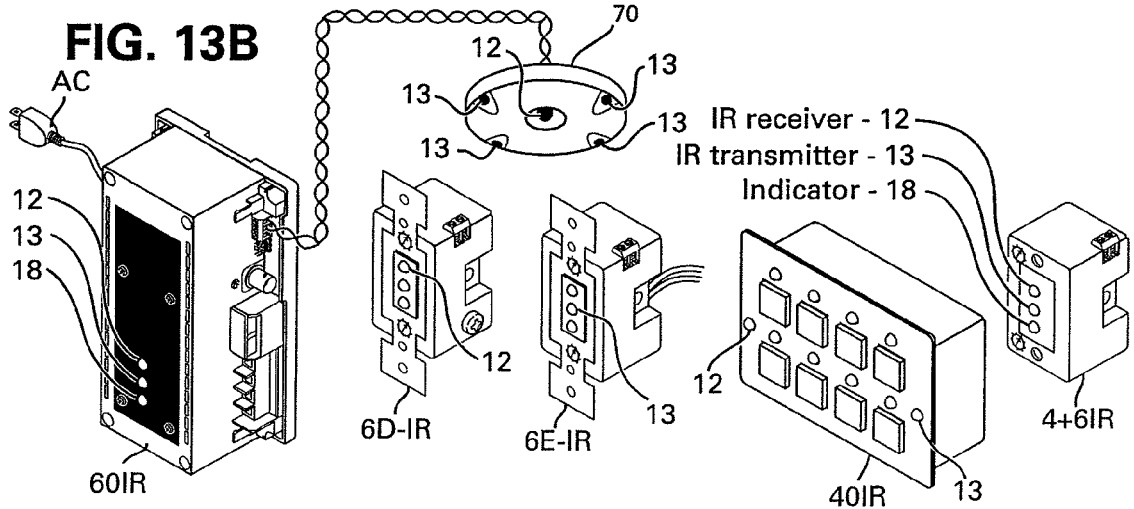

As shown in FIG. 13B the IR network includes two way IR repeater 70, which can be mounted on ceiling or onto walls (wall mount version not shown). The repeater shown is fed via wired network such as network 10 or 10P, but similar repeater with wireless receiver for converting the received RF wireless data into IR data is described in details in the above referred to application Ser. No. 11/509,315.

Further, while each of the shown relay control and communication circuits 6W, 6WP, 6RF and 6IR includes specific network, such as wired network 10, wired network with power feed 10P, wireless network and IR network, it is possible and on many instances necessary to combine two or three networks into one relay assembly such as 6E–WP+RF+IR.

The CPU 30 can process such separate input and output data from the separate networks and provide greater flexibility, particularly when wired network cannot be extended, or when direct optical path is impossible, similarly, different networks are needed for providing two separate controllers within the house, apartment, office or building to operate and/or communicate with the same relays series 6 or outlets series 4. For this reason the relays series 6 of the present invention can be provided with a combination of circuits for accommodating variety of networks including wired, wireless RF and IR.

The relay controller and communication circuits 6W, 6WP, 6RF and 6IR can be used with other home automation devices such as motion detectors or magnetic door switches (not shown) that operate alarm systems and/or for switching on the lights and/or can be introduced into temperature or humidity controllers (not shown) for switching air conditioners on-off. For some of those devices the current sensor 31, the relay driver 36 including the relay coil 6L and/or the indicator driver 38 are not needed and not used. This reduces the physical size of the circuit into a very small printed circuit board (PCB) that can be simple to introduce into magnetic switch assembly or motion detector or it can be installed into the electrical box 14 in a similar enclosure, shape or size as the outlets series 4 or any of the relays series 6 with all the optional variations such as IR and/or RF.

Similar IR TX 32, IR RX 33 and RF transceiver 39 circuits can be used with IR or RF repeaters/drivers for operating different A/V, background music, air conditioners and other appliances in conjunction with and for operating the relays series 6 and the AC outlets series 4. Such as the ceiling mount IR driver 70 shown in FIG. 13B, which communicate two way IR data inside a given room for enabling an IR network segment to operate within the room interior's optical paths.

The shown ceiling mounted IR driver 70 uses the circuit 6WP of FIG. 11B for its data and power feed but the circuit does not include the relay driver 36, the relay coil 6L and the current sensor 31. Another difference is in the IR TX driver 33 that drives four IR LEDs 13, directed to cover the whole room from the room's ceiling center. The IR receiver is shown in FIG. 13B as a photo diode or photo transistor 12 (which is connected to the IR RX and LPF 32 of FIG. 11D) does not show the IR pass filter 12A, but the IR photo transistor 12 of the IR driver 70 is protected from other light sources by the IR filter 12A, precisely as shown in FIG. 11D. Similarly all the IR receivers used with the relays 6-IR, 6C-IR, 6D-IR and 6E-IR and the AC outlets series 4 incorporating IR receiver employ the IR pass filter 12A such as shown in FIGS. 9A and 9B.

The Keypads 40WP, 40IR and 40RF shown in FIGS. 13A~13C, 14A, 14B, 15A and 15B incorporate circuits similar to the circuit 6WP with the variations described above and as used for the IR driver 70, with the exception that the CPU 41 shown in FIGS. 14A, 14B, 15A and 15B includes n number of indicator drivers, n number of key inputs and n number of inputs for n groups of digital rotary switch 34-1~34-$n$.

Figure 12:
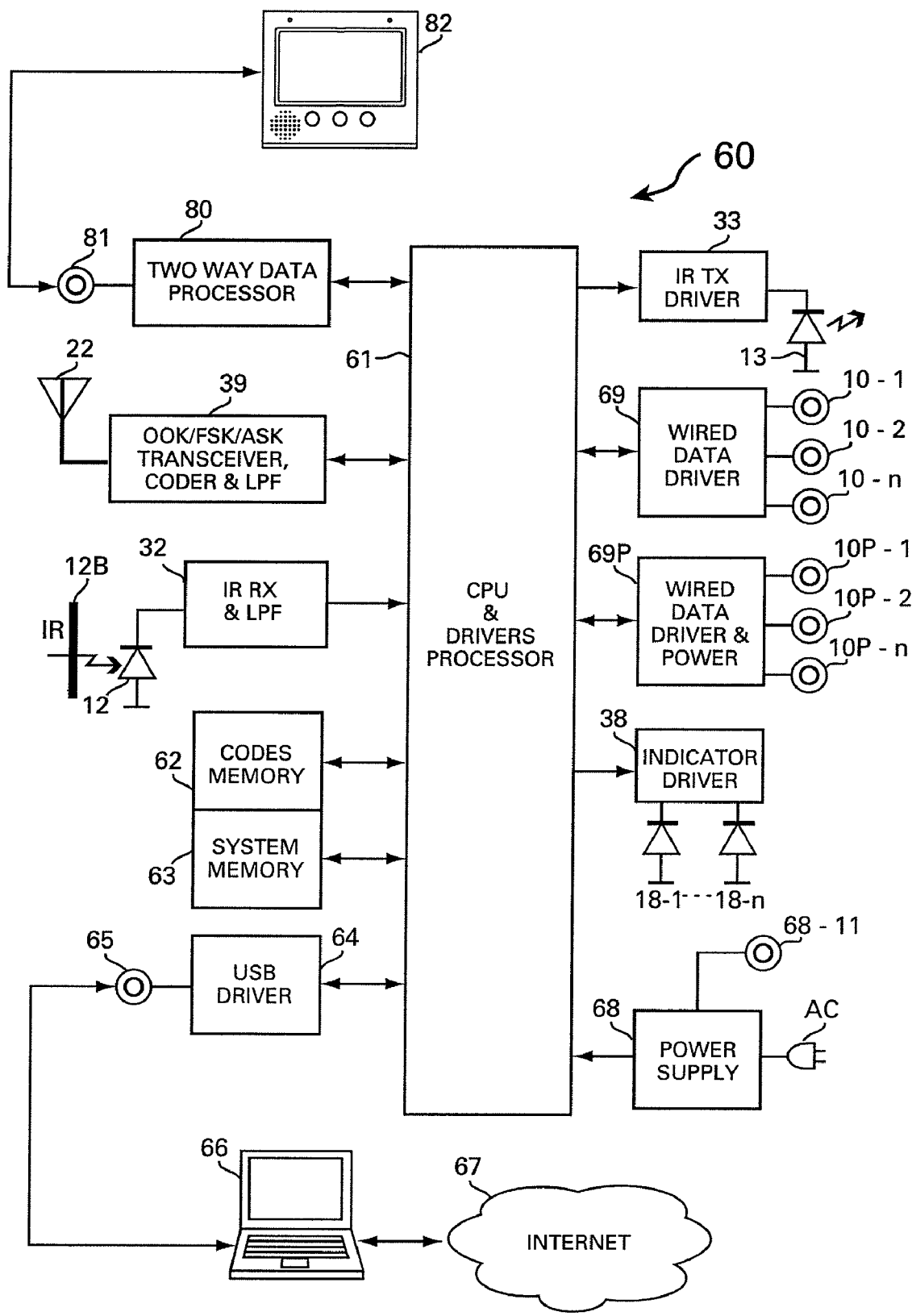
FIG. 12 is a block diagram of the power supply, the communication drivers and the connections for remote operation via the Internet of the home automation system of the present invention.

Shown in FIG. 12 is an home automation distributor and power supply 60 for distributing regulated current to the different devices of the wired network 10P, including relays series 6, outlet series 4, IR and RF drivers, keypads, motion detectors, magnetic switches and other communication devices using the same data, commands, controls and status information as described above. Further the distributor and power supply 60 processes and propagate the information (data, commands, control and status) to and from the home automation controller, the video interphone or the shopping terminal 82.

As described in the referenced U.S. patent application Ser. No. 11/509,315, the one of the advantages of using the video interphones or the shopping terminals for controlling the home automation is the ability to create fixed indexes or protocols for the different commands and status reports, which enable the use of a simple common, low cost remote control device for operating diverse appliances of the system. The common indexes are processed by and recorded into the memory of the home automation controller, the video interphone or the shopping terminal 82 and/or are installed into the memories 62 and 63 of the distributor and power supply 60 of FIG. 12, indexed to the different room/areas and the appliances addresses.

For the home automation system of the present invention therefore, a common low cost, two way hand held remote control device can be used for operating television, DVD, A/V, home theater, background music and all the explained home automation electrical appliances including lighting, air condition, alarm and others, in combination with the operation and the status indication through the hand held remote control devices. Such low cost remote control device for the house, apartment, office or building is realized by the use of two-way IR communication, in combination with the shown ceiling mounted IR driver 70 of FIG. 13B. Because of species particulars of the two-way IR hand held remote control and the construction of the IR driver 70 cannot be incorporated into this patent application, they are concurrently applied for a separate US patent.

Figure 13C:
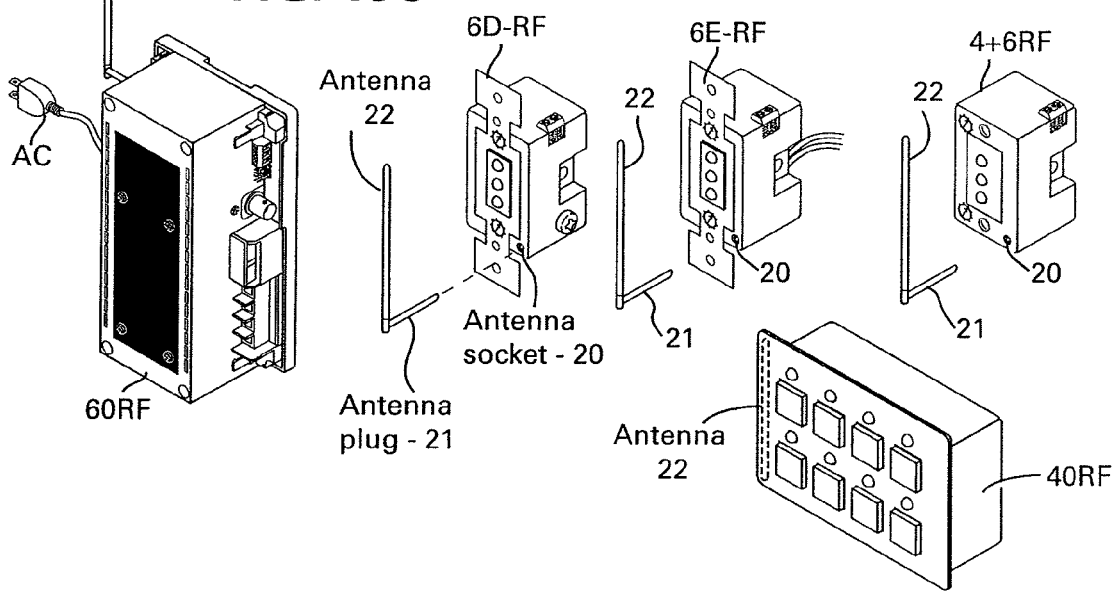

The distributor and power supply 60 can be used with any of the relay control and communicator circuits 6W, 6WP, 6RF and 6IR and with any of the circuits as used for outlets 4+6W, 4+6WP, 4+6IR and 4+6RF shown in FIGS. 13A~13C and with other devices such as magnetic contacts, thermostat and motion detectors (not shown), the IR driver 70 shown in FIG. 13B and the keypads shown in FIGS. 14A, 14B, 15A and 15B. Using the wired network 10P connected to the wired data driver and power circuit 69P of the distributor and power supply 60 enables the distributor to communicate with and feed the power to the connected devices.

Other devices, such as the relays 6C-W or 6E-W, can be connected to the wired network 10 of the wired data driver 69, but be powered separately via individual power supply, or directly from the power supply 68 via the power terminal or connector 68-11. The RF or IR devices shown in FIGS. 13B and 13C can communicate two way directly with the distributor and power supply 60IR and 60RF via the RF transceiver 39 and the antenna 22, or via the IR TX 33 and IR RX 32 through the respective IR LED 13 and the photo diode or the photo transistor 12 and/or via the IR driver 70 of FIG. 13B. Similarly the RF devices can communicate with RF drivers and RF repeaters that are not shown, but are fully explained in the referenced U.S. patent application Ser. No. 11/509,315. The connected RF or IR devices can be powered through the power supply 68 via the power connector or terminal 68-11, or via separate power supply, power adaptor, battery, and/or rechargeable battery.

The two way data processor 80 of the distributor and power supply shown in FIG. 12 communicate the received commands and status to the home automation controller, the video interphone or the shopping terminal 82 via the connector or terminal 81 and communicate with the connected relays series 6 or AC outlets 4 and other (not shown) devices through the wired network drivers 69, 69P, the RF driver 39 and the IR driver 33 with commands and controls to operate the relays and the appliances.

The codes memory 62 and the system memory 63 are installed with all the data pertaining the system, such as the addresses including room/area and the appliance number addresses, the indexing of all commands and a lookup table for converting the communicated indexes to the selected appliance operating commands, such lookup table enables the use of a common hand held two way remote control device (not shown) to operate the entire home automation system.

Further, the USB driver 64 shown in FIG. 12 can be connected via USB connector 65 to a PC 66 that is downloaded with a special designed program that includes the command codes, addresses, indexes and other data pertaining the system, downloaded from the home automation controller, the video interphone or the shopping terminal 82. By this setup the distributor and power supply 60 enables a resident of an apartment or a house or the manager and the personnel of an office to remotely connect to the PC 66 (via the Internet 67) and receive appliances status including alarm in process, and/or generate controls and commands for operating the electrical appliances such as switching on or off the water boiler, the air condition and similar.

FIGS. 13A, 13B and 13C show examples of home automation system network, with FIG. 13A showing wired twisted pair network 10P connected in cascaded twisted pair chain for connecting the relays 6D-WP, 6E-WP, the outlet 4+6WP and the keypad 40WP, which is shown in FIG. 14B in more details and will be explained later.

The wired network 10P similar to the wired network 10 and to the IR or RF network that are shown in FIGS. 13B and 13C communicate the two way information to the home automation controller, the video interphone or the shopping terminal 82 shown in FIG. 12 at random or at a controlled time, using token passing mechanism generated by the CPU 61 of the distributor and power supply 60 of FIG. 12 or the home automation controller 82. The distributor and the power supply 60 is shown to incorporate all the four discussed networks, the wired network and power feed 10P, the wired network 10, the IR and the RF network. Alternatively the distributor and power supply 60W (not shown) can incorporate the driver circuit 69 only for feeding up to n wired networks via the connectors 10P-1~10-n, or the distributor and power supply 60WP may incorporate the driver circuit 69P only for n wired networks with power feed 10P via connectors 10P-1~10P-n. The distributor and power supply 60IR can incorporate only the RX and TX circuits 32 and 33 for operating an IR network and the distributor and power supply 60RF can incorporate only the transceiver circuit 39 for operating the wireless network, as shown in FIGS. 13A~13C.

Accordingly, FIG. 13B shows similar home automation system, using the IR driver 70 to communicate two way IR commands and data. If the distributor and power supply 60IR can be installed in location that is optically accessed by the relays, the outlet and the keypad, the use of the IR driver will not be necessary. The IR driver 70 is shown connected via the wired twisted pair network 10, because it does not have a direct optical access to the IR receiver 12 and the IR transmitter 13. In this case the distributor and power supply 60IR shown does incorporate the wired network driver 69 in addition to the RX 32 and IR TX 33.

Figure 15A:
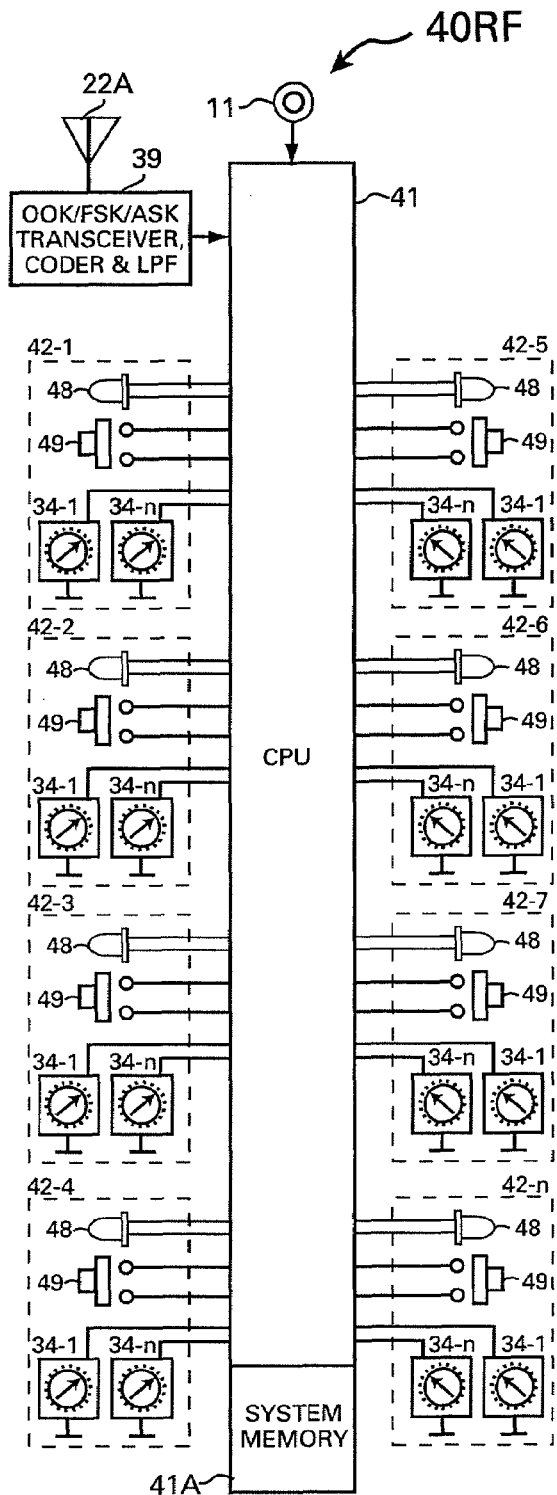
FIGS. 15A and 15B are block diagrams of a key panel or keypad for switching on and off selected appliances via IR or wireless network.

FIG. 13C shows the distributor and power supply 60RF for providing RF network via the antennas 22 including the matching antennas 22 of the relays 6D-RF and 6E-RF, of the outlet 4+6RF and of the keypad 40RF, which is shown in FIG. 15a and explained later. From the shown networks and distribution it become clear that the present invention can be operated via wired, IR and RF networks and any combinations thereof.

As explained above the different networks, independently or combined provide for the devices on the network to communicate randomly, or in organized timing using token passing mechanism. The relatively slow speed data, and the non frequent incidents of communicating on-off command and appliances status, makes a continuous round the clock token passing mechanism an unnecessary activity over the network.

Therefore, the preferred embodiment of the present invention uses signal sensing mechanism for permitting the devices to communicate only when no signal is present for a duration of n milli seconds. Such delays in communicating non frequent short commands and status data, does not affect the efficiency and the speed needed for the operating of the home automation of the present invention. However, any type of well known token passing mechanism, program and circuit and/or any well known program and signal sensing circuit can be used to communicate data, control, command and status on the different networks of the present invention.

The keypads 40W, 40WP, 40RF and 401R shown in FIGS. 14A, 14B, 15A and 15B employ essentially the same circuits employed and described above for all the other devices of home automation system of the present invention. The shown CPU 41 and the system memory 41A are similar to the CPU 30 and memory 30A of FIGS. 11A~11D. The digital rotary switches 34-1~34-n and the circuits 37 for the wired network 10, 37P for the wired network and power feed 10P, 32 and 33 for the IR network and 39 for the RF network are identical circuits with the shown circuits for the relays, the AC outlets and for all other devices such as add-on circuit for motion detectors, magnetic switch, humidity and temperature control and others as explained above, all shown in FIGS. 11A~11D.

The keypads or key panels 40 are in essence an array of switches and indicators for mounting onto standard electrical boxes, such as shown as box 14 in FIGS. 4A and 4B, or on walls or incorporated into a table top case (not shown), powered, for example, by a battery and communicate via IR and/or RF similar to a remote control device. Several keypads can be installed for example in kitchens, dinning room, entrance and main bedroom etc, or in offices main entrance and/or in the manager room of an office. The basic key functions are to switch on and off lights and appliances in the home, apartment, office or building, and indicate the lights or the appliances on off status. For this reason the preferred embodiment of the present invention uses the two digital rotary switches 34-1 and 34-n for assigning an address to each individual key, enabling the user to select which key will operate and monitor (via the key's indicator) a given appliance status.

Each shown key 49 is grouped into a group 42 shown as groups 42-1~42-n in a dashed line boxes, containing indicator 48 and the two or more mentioned digital switches 34-1~34-n. As explained above, the digital switches 34 shown as rotary switches, are the preferred embodiment of the present invention, because they provide for simple user assignment of each key to a given appliance. However any number or type of digital, binary and other switches including well known DIP switches can be used. Similarly each key can be assigned an address by installing the codes into the memory 41A via the home automation controller, the video interphone or the shopping terminal 82 shown in FIG. 12, or directly from a PC incorporating such program for installing addresses to the memories 30A, 41A, 62 and 63 shown in FIGS. 11A~11A, 12, 14A, 14B, 15A and 15D. The preferred embodiment also provide for several keys, for example 3 keys, to operate the same appliance, such as air condition, with one key function as on-off switch, the other two for temperature up and temperature down. Only one set of digital switches 34 is needed for all the three keys, assigned to one appliance of the example, for switching the air condition on-off and adjusting the temperature up-down.

The function of the indicator 48 shown in each key group 42, similar to the indicators 18 shown for the add-on relays series 6 and the AC outlets series 4, are varied. The indicators 18 and 48 can be multi color LED indicator such as the well known red-green-orange LEDs. The indicators can be programmed, for example, to flash green when command is processed, or flashed red to indicate that other commands are currently processed. The indicator can light green to show appliance is off, red for appliance is on and yellow, for example, that the appliance is in a sleep mode. In the case of operating an air conditioner by the three keys 49 mentioned above, the temperature down indicator can be green, the temperature up indicator can be orange or red, or changing from orange (warm) to red (hot). It is also possible to use several LED indicators or the well known LCD indicators (not shown) to show the actual temperature setting, instead of the LED indicators 48.

Figure 15B:
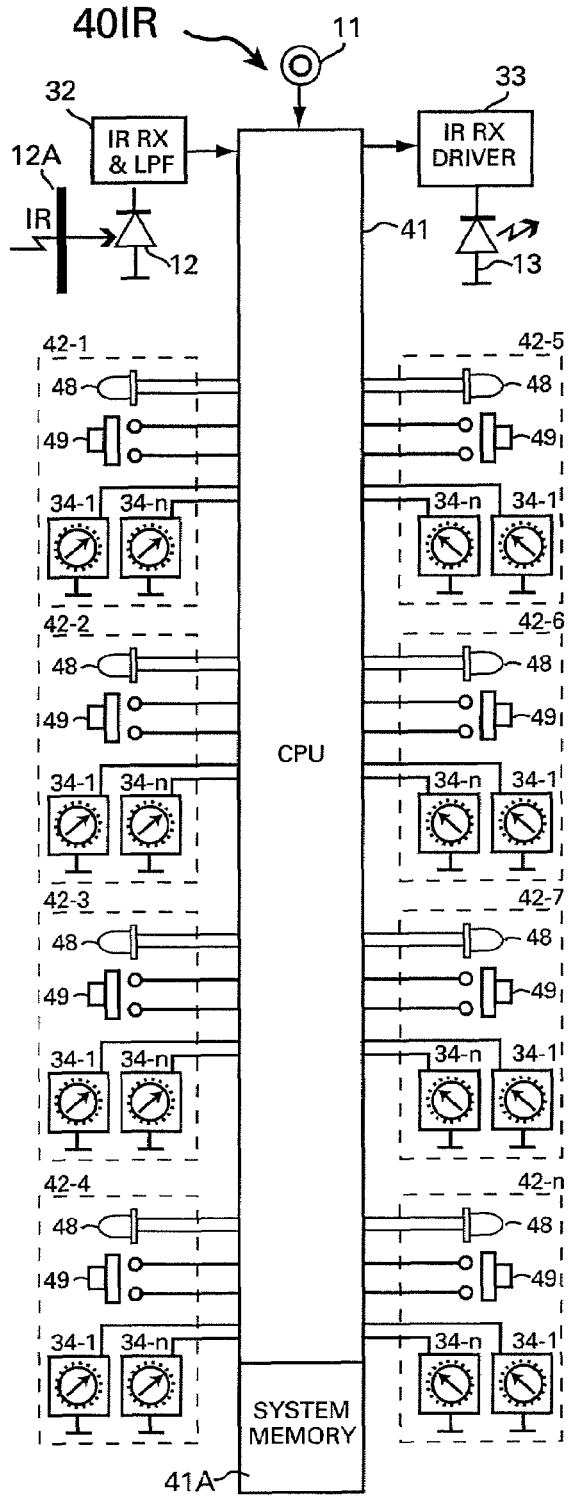

Each of the shown keypads 40W in FIGS. 14A, 40WP in FIGS. 14B, 40RF in FIGS. 15A and 401R in FIG. 15B, incorporate the specific circuits for a specific network such a circuit 37 for wired network, circuit 37P for wired network 10P with power extractor, circuit 39 for wireless network and circuits 32 and 33 for IR network. However it is possible to include all the four circuits into single keypad for having a common keypad 40 communicating via any of the networks and powered through the network.

Further, it is possible to include the power supply 68, the two way data processor 80 and the USB driver 64 shown in FIG. 12 to the keypad and transform the keypad 40 into keypad, distributor and power supply 40-60 (not shown) for mounting into an electrical box 14, such as shown in FIGS. 4A and 4B and reduce by such arrangement the number of devices of the system.

It is clear from the explanations above, that an add-on SPDT and DPDT relays of the relays series 6 and AC outlets series 4 of the present invention provide a simple method and apparatus for introducing home automation alongside the commonly used manual switches and the two only used electrical wires, offering simple low cost local and remote operation, in conjunction with video interphone or shopping terminals or with similar home automation controller and remote operation via the Internet, using PC and/or PDA devices, and receive updated status from the system locally via indicators, or through the video interphone or the shopping terminals display, and remotely through a PC or PDA devices.

It is also clear that a direct AC exposure is limited to the relay's contacts, while all the surrounding circuits are low voltage or battery operated circuits that are not subject to the very costly testing procedures even though they need the approvals by the certifying organizations such as UL, VDE, UTV and the like.

It is also clear that the relays, the outlets and other connected devices can be installed into standard electrical boxes, be covered by covers that are used for the mechanical/manual switches of the ordinary electrical system in place, providing matching design, color and finish, without obstructing the interiors and architecture design.

It should be understood, of course, that the foregoing disclosure relates to only a preferred embodiment of the invention and that it is intended to cover all changes and modifications of the example of the invention herein chosen for the purpose of the disclosure, which modifications do not constitute departures from the spirit and scope of the invention.

What is claimed is:

1. A method for adding and connecting an AC current sensor assembly to an AC outlet for integrating an AC operated appliance into home automation network, said current sensor, selected from a coil with an insulated passage for an electric wire and a transformer having primary winding for serial connection with said electric wire and an insulated secondary winding, for outputting an AC signal level corresponding to a current drain through said electric wire, is included in a control and communication circuit of said AC current sensor assembly;

wherein said control and communication circuit includes at least one network driver selected from a group comprising of wired network driver and power extractor, wired network driver, RF network driver, IR network driver and combinations thereof and wherein said AC current sensor assembly is similar to a shape and a size of an AC outlet fit for installation into standard electrical box, comprising the steps of:

a. running said electric wire to said AC outlet through said current sensor, selected from running said electric wire through said passage and connecting said electric wire serially with said primary winding and a power terminal of said AC outlet;

b. installing said AC current sensor assembly adjacent to said AC outlet into said electrical box;

c. setting an address through one of digital switches and a recordable memory included in said control and communication circuit;

d. connecting said control and communication circuit to said network;

e. connecting said AC appliance to said AC outlet; and f. processing said AC signal outputted from said sensor for communicating data pertaining to the power statuses of said appliance to said network.

2. The method for adding and connecting an AC current sensor assembly according to claim 1, wherein said control and communication circuit is connected to a power source selected from via said wired network through said power extractor and a dedicated power line.

3. The method for adding and connecting an AC current sensor assembly according to claim 1, wherein said home automation is controlled by a central controller selected from a group consisting of home automation controller, video interphone, shopping terminal and combinations thereof, and wherein said central controller includes drivers selected from a group consisting of wired network driver, RF network driver, IR network driver and combinations thereof for communicating with said control and communication circuit via said network.

4. The method for adding and connecting an AC current sensor assembly according to claim 3, wherein said central controller controls said home automation through a network distributor including network drivers selected from a group consisting of wired network and power feed driver, wired network driver, RF network driver, IR network driver and combinations thereof, for propagating controls and statuses via said network and a power supply for powering said control and communication circuit selected from via said wired network and power feed driver and via dedicated power line and power connector.

5. The method for adding and connecting an AC current sensor assembly according to claim 1, wherein said appliance is operated by a keypad comprising of plurality of keys with indicators and a control and communication circuit including a memory and a circuit for setting individual addresses to said keys and said indicators selected from digital switches and recordable memory and at least one network driver selected from a group comprising of wired network driver and power extractor, wired network driver, RF network driver, IR network driver and combinations thereof, wherein said keypad can be installed onto said electrical box, on a wall or placed on a table top, said method comprising the further steps of:
 a. installing said keypad onto said electrical box, on a wall or placing said keypad on a table top;
 b. feeding power to said keypad via a combination selected from a group consisting of a dedicated power line through a power connector, said wired network through said power extractor and a battery through battery terminals;
 c. setting an address to one of said keys and indicators to coincide with the address set to said appliance;
 d. setting addresses to other keys and indicators to coincide with addresses set to other appliances included in said home automation network;
 e. operating said keys for switching said appliances on-off and for controlling other functions of said appliances; and
 f. monitoring the appliances statuses via said indicators.

6. An AC current sensor assembly for connection to an AC outlet for integrating an AC operated appliance into home automation network, said AC current sensor assembly includes a control and communication circuit and a sensor, selected from a coil with an insulated passage for an electric wire and a transformer having primary winding for serial connection with said electric wire and an insulated secondary winding, for outputting an AC signal level corresponding to a current drain through said electric wire;
 wherein said AC current sensor assembly is similar to a shape and a size of an AC outlet fit for installation into standard electrical box adjacent to said AC outlet for connecting said electric wire to said AC outlet through said current sensor assembly and said AC appliance to said AC outlet;
 wherein said control and communication circuit includes an address setting circuit selected from digital switches and recordable memory for setting an address for communicating via said network; and
 wherein said control and communication circuit processes said AC signal outputted from said sensor for communicating data pertaining to the power statuses of said appliance to said network.

7. The AC current sensor assembly according to claim 6, wherein said control and communication circuit includes at least one network driver selected from a group comprising of wired network driver and power extractor, wired network driver, RF network driver, IR network driver and combinations thereof and is connected to a power source selected from via said wired network through said power extractor and a dedicated power line.

8. The AC current sensor assembly according to claim 6, wherein said home automation is controlled by a central controller selected from a group consisting of home automation controller, video interphone, shopping terminal and combinations thereof, and wherein said central controller includes drivers selected from a group consisting of wired network driver, RF network driver, IR network driver and combinations thereof for communicating with said control and communication circuit via said network.

9. The AC current sensor assembly according to claim 8, wherein said central controller controls said home automation through a network distributor including network drivers selected from a group consisting of wired network and power feed driver, wired network driver, RF network driver, IR network driver and combinations thereof for propagating controls and statuses via said network and a power supply for powering said control and communication circuit selected from via said wired network and power feed driver and via dedicated power line and power connector.

10. The AC current sensor assembly according to claim 6, wherein said appliance is operated by a keypad comprising of plurality of keys with indicators and a control and communication circuit including a memory and a circuit for setting individual addresses to said keys and said indicators selected from digital switches and recordable memory and at least one network driver selected from a group comprising of wired network driver and power extractor, wired network driver, RF network driver, IR network driver and combinations thereof;
 wherein said keypad can be installed onto said electrical box, on a wall or placed on a table top and wherein a power is fed to said keypad via a combination selected from a group consisting of a dedicated power line through a power connector, said wired network through said power extractor and by a battery through terminals;
 wherein the address of at least one of said keys and indicators is set to coincide with the address set to said appliance and the addresses set to other keys and indicators are to coincide with the addresses set to other appliances included in said home automation network for using said keys to switch said appliances on-off and to control other functions of said appliances; and monitoring the appliances statuses via said indicators.

* * * * *